US012690445B2

(12) United States Patent
Xie et al.

(10) Patent No.: US 12,690,445 B2
(45) Date of Patent: Jul. 21, 2026

(54) SEMICONDUCTOR DEVICE INCLUDING BACKSIDE SIGNAL WIRING AND FRONTSIDE POWER SUPPLY

(71) Applicant: International Business Machines Corporation, Armonk, NY (US)

(72) Inventors: Ruilong Xie, Niskayuna, NY (US); Chanro Park, Clifton Park, NY (US); Juntao Li, Cohoes, NY (US); Min Gyu Sung, Latham, NY (US); Julien Frougier, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 481 days.

(21) Appl. No.: 18/327,444

(22) Filed: Jun. 1, 2023

(65) Prior Publication Data

US 2024/0404950 A1     Dec. 5, 2024

(51) Int. Cl.
| | |
|---|---|
| *H01L 23/528* | (2006.01) |
| *H01L 29/06* | (2006.01) |
| *H01L 29/40* | (2006.01) |
| *H01L 29/417* | (2006.01) |
| *H01L 29/423* | (2006.01) |
| *H01L 29/66* | (2006.01) |
| *H01L 29/775* | (2006.01) |
(Continued)

(52) U.S. Cl.
CPC ........ *H10W 20/427* (2026.01); *H10D 30/014* (2025.01); *H10D 30/43* (2025.01); *H10D 30/6729* (2025.01); *H10D 30/6735* (2025.01); *H10D 62/121* (2025.01); *H10D 64/01* (2025.01)

(58) Field of Classification Search
CPC .......... H01L 23/5286; H01L 21/76897; H10D 30/014; H10D 30/43; H10D 30/6729; H10D 30/6735; H10D 62/121; H10D 64/01; H10D 30/6757

USPC ........................................................ 257/347
See application file for complete search history.

(56) References Cited

U.S. PATENT DOCUMENTS

| | | | |
|---|---|---|---|
| 10,636,739 B2 | 4/2020 | Beyne et al. | |
| 10,797,139 B2 | 10/2020 | Morrow et al. | |
(Continued)

FOREIGN PATENT DOCUMENTS

| | | |
|---|---|---|
| CN | 114725058 A | 7/2022 |

OTHER PUBLICATIONS

Chen, R., et al., "Invited Paper: Opportunities of Chip Power Integrity and Performance Improvement through Wafer Backside (BS) Connection", SLIP'22, Nov. 2022, pages, San Diego, CA USA.

(Continued)

*Primary Examiner* — Tong-Ho Kim
(74) *Attorney, Agent, or Firm* — Scully, Scott, Murphy & Presser, P.C.; Samuel Waldbaum

(57) ABSTRACT

A semiconductor device is provided including frontside interconnects (i.e., metal wires) used mainly as power supplies and backside interconnects (i.e., metal wires) used mainly as signal wiring. The semiconductor device includes a frontside back-end-of-the-line (BEOL) structure including frontside metal wires located in the frontside of the device, and a backside BEOL interconnect structure including backside metal wires located in a backside of the device. At least 90% of the frontside metal wires are power distribution metal wires and at least 90% of the backside metal wires are signal wires.

19 Claims, 32 Drawing Sheets

(51) Int. Cl.

| | |
|---|---|
| *H10D 30/01* | (2025.01) |
| *H10D 30/43* | (2025.01) |
| *H10D 30/67* | (2025.01) |
| *H10D 62/10* | (2025.01) |
| *H10D 64/01* | (2025.01) |
| *H10W 20/41* | (2026.01) |

(56) References Cited

U.S. PATENT DOCUMENTS

| | | | |
|---|---|---|---|
| 11,411,100 B2 | 8/2022 | Wang et al. | |
| 11,424,332 B2 | 8/2022 | Yu et al. | |
| 2018/0145030 A1 | 5/2018 | Beyne et al. | |
| 2018/0218973 A1 | 8/2018 | Nelson et al. | |
| 2019/0164882 A1 | 5/2019 | Chen et al. | |
| 2020/0105671 A1 | 4/2020 | Lai et al. | |
| 2020/0373242 A1 | 11/2020 | Hiblot et al. | |
| 2021/0104435 A1 | 4/2021 | Son et al. | |
| 2021/0111115 A1 | 4/2021 | Morrow et al. | |
| 2021/0134721 A1 | 5/2021 | Chiang et al. | |
| 2021/0202385 A1 | 7/2021 | Huang et al. | |
| 2021/0202472 A1 | 7/2021 | Thomson et al. | |
| 2021/0376093 A1 | 12/2021 | Chu et al. | |
| 2021/0399099 A1 | 12/2021 | Chu et al. | |
| 2021/0408249 A1* | 12/2021 | Yu | H01L 23/5283 |
| 2022/0139911 A1 | 5/2022 | Wei et al. | |
| 2022/0359369 A1* | 11/2022 | Tsai | H01L 21/6835 |
| 2022/0384589 A1 | 12/2022 | Su et al. | |

OTHER PUBLICATIONS

Mukesh, S., et al., "A Review of the Gate-All-Around Nanosheet FET Process Opportunities", Electronics, Nov. 2022, 11 pages, 3589.

\* cited by examiner

SEMICONDUCTOR DEVICE INCLUDING BACKSIDE SIGNAL WIRING AND FRONTSIDE POWER SUPPLY

BACKGROUND

The present application relates to semiconductor technology, and more particularly to a semiconductor device including frontside interconnects (i.e., metal wires) used mainly as power supplies and backside interconnects (i.e., metal wires) used mainly as signal wiring.

When forming a structure including a plurality of complementary metal oxide semiconductor (CMOS) devices, such as integrated circuits, standard cells can be used as a base unit for designing and manufacturing the integrated circuits. The standard cell(s) can be used to form one or more functional circuits, and each standard cell can have the same footprint. Using standard cells when designing complex circuits and components reduces design and manufacture costs.

In such structures, signal wiring is typically present on a frontside of a wafer, while power sources are typically present on a backside of the wafer. Typically, the backside power source is formed after frontside processing which includes CMOS device formation and frontside signal wiring formation. After forming the backside power source, the CMOS device can be tested from the backside of the wafer. Conventional optical fault isolation (such as, for example, laser voltage probing and photon emission microscopy) and nanoprobing techniques are generally required for Electrical Fault Isolation/Electrical Failure Analysis (EFI/EFA) of advanced semiconductor devices.

SUMMARY

A semiconductor device is provided including frontside interconnects (i.e., metal wires) used mainly as power supplies and backside interconnects (i.e., metal wires) used mainly as signal wiring. In one aspect of the present application, a semiconductor device is provided. In one embodiment, the semiconductor device includes a transistor located in a frontside of the device, the transistor including a gate structure located adjacent to a pair of source/drain regions. The semiconductor device further includes a frontside back-end-of-the-line (BEOL) structure including frontside metal wires located in the frontside of the device, and a backside BEOL interconnect structure including backside metal wires located in a backside of the device. In the present application, at least 90% of the frontside metal wires are power distribution metal wires and at least 90% of the backside metal wires are signal wires. Signal wires are denser than power distribution metal wires. Dense signal wires in the backside of the structure provide for easier failure analysis. Also, in such a device the parasitic capacitance can be optimized for both the frontside metal wires and the backside metal wires.

DETAILED DESCRIPTION

Figure 1:
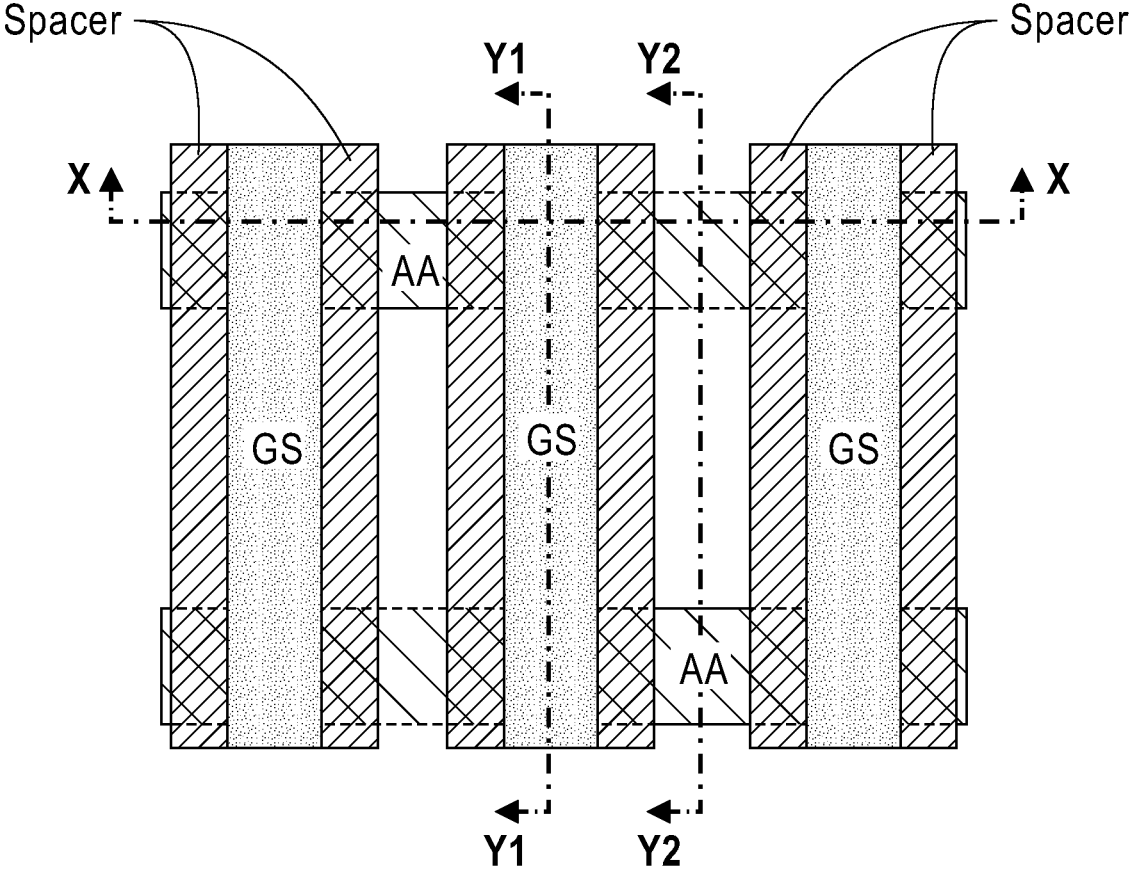
FIG. 1 is a top down view showing a device layout that can be employed in the present application, the device layout including a plurality of gate structures that are oriented perpendicular to different active areas; the illustrated device layout includes cut X-X, cut Y1-Y1, and cut Y2-Y2.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

In typical devices including frontside interconnect containing dense signal wires and backside interconnect containing backside power sources, the frontside interconnects including the dense signal wiring (which have a high chance of failure) are buried underneath active devices and backside power sources, and thus block the access of nanoprobes used in EFI/EFA.

Also, in structure including frontside signal wiring and backside power supplies, the frontside source/drain contact structure can have more overlap with the gate metal. This leads to high parasitic capacitance which is not desirable for signal wiring because it can increase RC delay. Furthermore, and in structures including frontside signal wiring and backside power supplies, the backside source/drain contact structure has less overlap with the gate metal. This can lead to low parasitic capacitance which is not desirable for the power supply because it is better to have decoupling capacitance for power supplies.

Figure 17A:
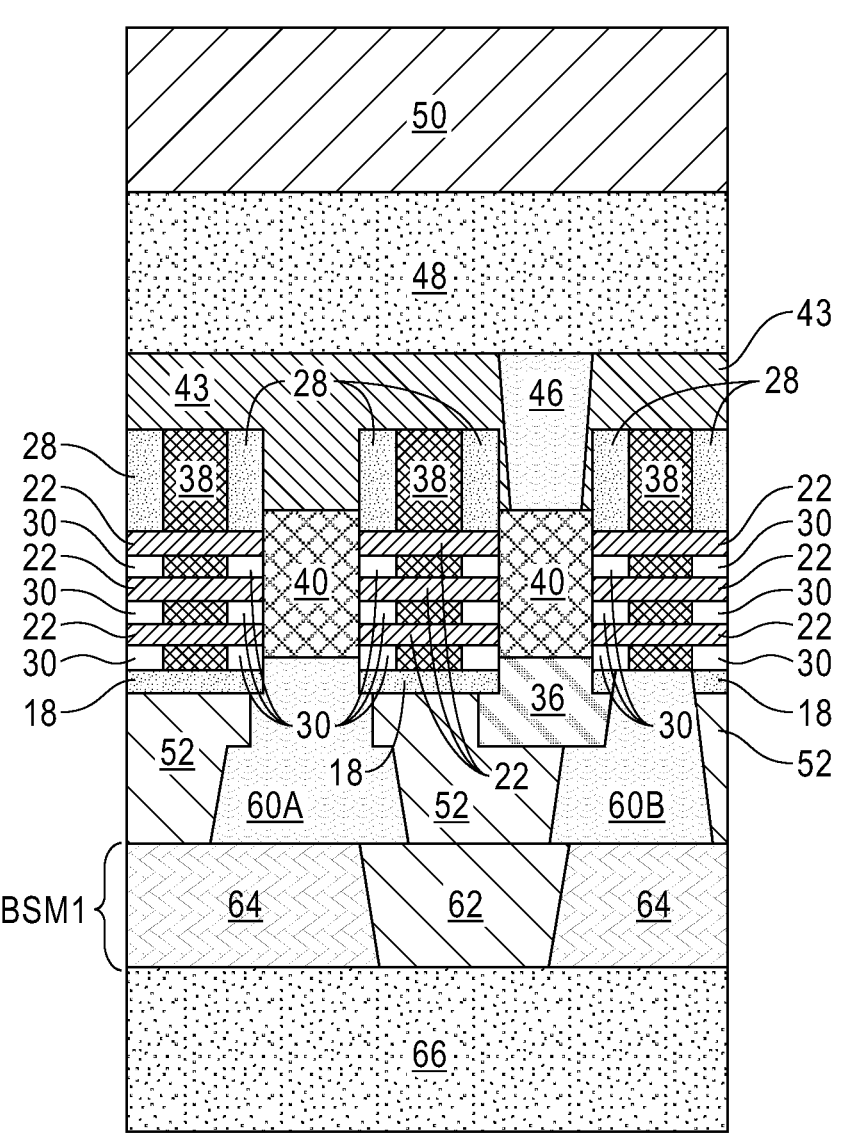
FIGS. 17A, 17B and 17C are cross sectional views of the exemplary semiconductor structure shown in FIGS. 16A, 16B and 16C, respectively, after forming a second backside ILD layer, and first backside metal level, and a backside BEOL structure including backside metal wires.
Figure 17C:
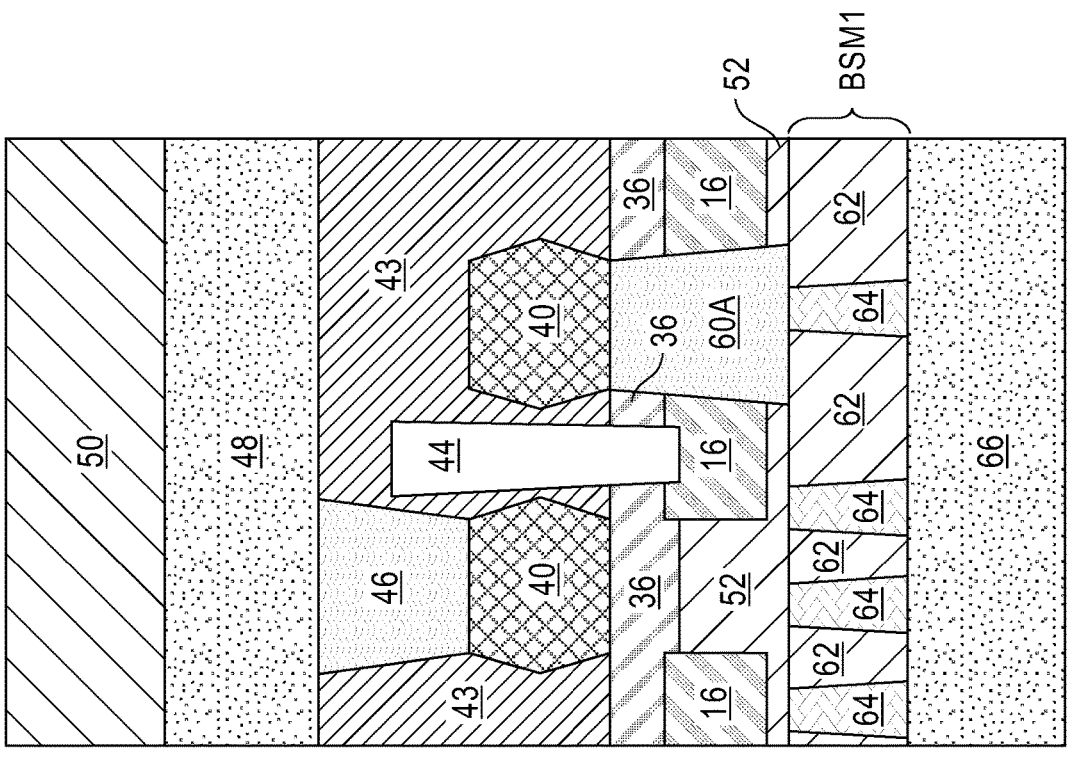
Figure 17B:
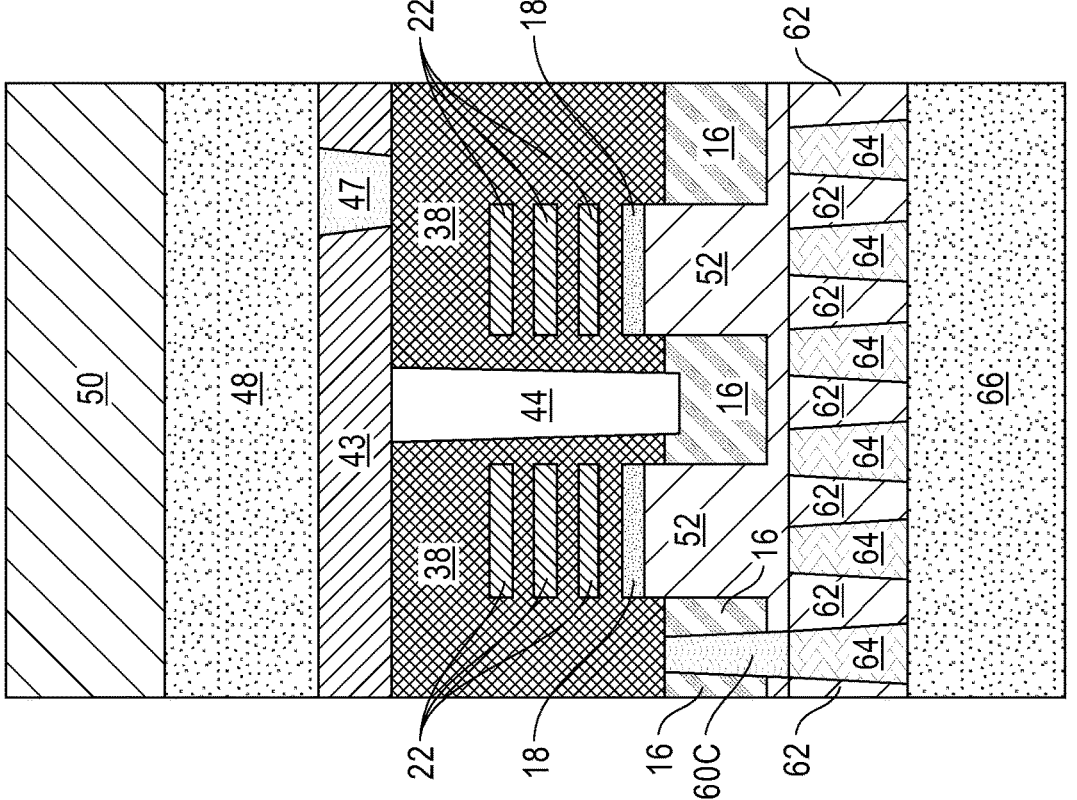

As stated above and in one aspect of the present application, a semiconductor device is provided. In one embodiment, and as is shown in FIGS. 17A-17C, the semiconductor device includes a transistor (see, for example, middle gate structure 38 shown in FIG. 17A) located in a frontside of the device, the transistor including gate structure 38 located adjacent to a pair of source/drain regions 40. This transistor can be referred to a first transistor, and the gate structure of this first transistor can be referred to as a first gate structure. The semiconductor device further includes frontside BEOL structure 48 including frontside metal wires (not specifically shown but intended to be within the frontside BEOL structure 48) located in the frontside of the device, and a backside BEOL interconnect structure 66 including backside metal wires (not specifically shown but intended to be within the backside BEOL structure 66) located in a backside of the device. In the present application, at least 90% of the frontside metal wires are power distribution metal wires (used for power distribution) and at least 90% of the backside metal wires are signal wires (used for signal distribution). Signal wires are denser than power distribution metal wires. Thus, having 90% or greater of the dense signal wires in the backside of the structure provides for easier failure analysis of the device. Also, in such a device the parasitic capacitance can be optimized for both the frontside metal wires and the backside metal wires. In the present application, the frontside BEOL structure 48 and the backside BEOL structure 66 are multilevel structures that contain metal wires (i.e., metal interconnects) embedded in one or more dielectric materials. Each of the metal levels within the frontside BEOL structure 48 and the backside BEOL structure 66 would look similar to first backside metal level, BSM1, shown in FIGS. 17A-17C.

In some embodiments and as is shown in FIGS. 17A-17C, the device further includes a middle-of-the-line (MOL) level located between frontside BEOL structure 48 and the transistor. In such embodiments, the MOL level includes frontside source/drain contact structure 46 embedded in MOL dielectric layer 43. The frontside source/drain contact structure 46 provides a way of electrically connecting the source/drain of the transistor to the frontside BEOL structure 48.

In some embodiments and as is shown in FIGS. 17A-17C, frontside source/drain contact structure 46 electrically connects one source/drain region 40 of the pair of source/drain regions of the transistor to frontside BEOL structure 48. The frontside source/drain contact structure 46 provides a way of electrically connecting the source/drain of the transistor to the frontside BEOL structure 48.

In some embodiments and as is shown in FIGS. 17A-17C, the device further includes backside source/drain contact structure 60A contacting a surface of the other source/drain region 40 of the pair of source/drain regions of the transistor and backside gate contact structure 60C contacting gate structure 38 of the transistor. These contact structures allow for connecting the transistor (i.e., source/drain and gate structure) to the backside BEOL structure 66.

In some embodiments and as is shown in FIGS. 17A-17C, backside source/drain contact structure 60A and backside gate contact structure 60C are both embedded in a backside interlayer dielectric layer (i.e., first backside interlayer dielectric layer 52). This provides necessary isolation within the backside of the device.

In some embodiments and as is shown in FIGS. 17A-17C, backside gate contact structure 60C passes through shallow trench isolation structure 16 and shallow trench isolation structure 16 is present in a backside interlayer dielectric layer (i.e., the first backside interlayer dielectric layer 52). The backside gate contact structure 60C permits electrically connecting the gate structure of the transistor to the backside of the device.

In some embodiments and as is shown in FIGS. 17A-17C, the device further includes first backside metal level, BSM1, located between backside BEOL structure 66 and both backside source/drain contact structure 60A and backside gate contact structure 60C. The first backside metal level, BSM1, includes backside interconnects 64 that electrically connect backside BEOL structure 66 to backside source/drain contact structure 60A and backside gate contact structure 60C. Backside interconnects 64 are signal wires.

In some embodiments and as is shown in FIGS. 17A-17C, backside interconnects 64 are embedded in a backside interlayer dielectric layer (i.e., second backside interlayer dielectric layer 62). This provides necessary isolation of the backside interconnects 64.

In some embodiments and as is shown in FIGS. 17A-17C, the one source/drain region 40 of the pair of source/drain regions that is electrically connected to frontside BEOL structure 48 is located on a surface of dielectric structure 36, the dielectric structure 36 is present in both the frontside and the backside of the device. The dielectric structure 36 provides a landing place for the source/drain regions and can be used to prevent backside contacting of the source/drain regions of selected transistors.

In some embodiments and as is shown in FIGS. 17A-17C, the device further includes bottom dielectric isolation layer 18 located beneath the transistor and adjacent to the dielectric structure 36. The bottom dielectric isolation layer 18 serves to isolate the frontside of the device from the backside of the device.

In some embodiments and as is shown in FIGS. 17A-17C, dielectric structure 36 contacts a sidewall of bottom dielectric isolation layer 18.

In some embodiments and as shown in as is shown in FIGS. 17A-17C, the device further includes another transistor (including the gate structure 38 to the right of the middle gate structure 38) located adjacent to the transistor, wherein the another transistor includes another gate structure 38, and the another transistor includes the one source/drain region 40 of the pair of source/drain regions that is electrically connected to frontside BEOL structure 48 as one of the another transistor source/drain regions. The another transistor can be referred to as second transistor and the another gate structure can be referred to herein as second gate structure.

In some embodiments and as is shown in FIGS. 17A-17C, the device further includes another (i.e., second) backside gate contact structure 60B contacting the another (i.e., second) gate structure 38 and a sidewall and a horizontal surface of dielectric structure 36.

In some embodiments and as is shown in FIGS. 17A-17C, the device further includes another (i.e., second) bottom dielectric isolation layer 18 located beneath the another (i.e., second) transistor, the another backside gate contact structure 60B passes through the another bottom dielectric isolation layer 18.

In some embodiments and as is shown in FIGS. 17A-17C, the device further includes first backside metal level, BSM1, located between backside BEOL structure 66 and the another backside gate contact structure 60B. The first backside metal level, BSM1, includes backside interconnect 64 connecting the another backside gate contact structure 60B to backside BEOL structure 66. Backside interconnect 64 is a signal wire.

In some embodiments and as is shown in FIGS. 17A-17C, backside interconnects 64 is embedded in a backside interlayer dielectric layer (i.e., the second backside interlayer dielectric layer 62).

In some embodiments and as is shown in FIGS. 17A-17C, the transistor is a nanosheet transistor including a vertical stack of suspended semiconductor channel material nanosheets 22, and the gate structure 38 of the transistor wraps around each semiconductor channel material nanosheet 22 of the vertical stack of suspended semiconductor channel material nanosheets.

In some embodiments and as is shown in FIGS. 17A-17C, the device further includes carrier wafer 50 located on a surface of frontside BEOL structure 46.

In some embodiments and as is shown in FIGS. 17A-17C, the device further includes a frontside gate contact structure 47 connecting another gate structure 38 of another transistor to the frontside BEOL structure 48, wherein the another gate structure of the another transistor is tied-off.

In embodiments, the power distribution metal wires present in the frontside BEOL structure 46 have a first density and the signal metal wires present in the backside BEOL structure have a second density that is greater than the first density.

In the present application, a semiconductor device is described and illustrated as containing nanosheet transistors. A transistor includes a source region, a drain region, a semiconductor channel region located between the source region and the drain region, and a gate electrode located above the semiconductor channel region. A nanosheet transistor is a non-planar transistor that includes a vertical stack of spaced apart semiconductor channel material nanosheets as the semiconductor channel region with a pair of source/drain regions located at each of the ends of the vertical stack of spaced apart semiconductor channel material nanosheets. The gate structure including a gate dielectric and a gate electrode wraps around each of the spaced apart semiconductor channel material nanosheets. Although nanosheet transistors are described and illustrated, the present application can used with planar transistors, or other non-planar transistors such as, for example, semiconductor nanowire transistors or finFET transistors.

In the present application, the semiconductor device includes a frontside and a backside. The frontside of the semiconductor device of the present application includes a side of the device that includes the transistors, MOL level, and frontside BEOL structure. The backside of the semiconductor device of the present application is the side of the device that is opposite the frontside. In a nanosheet transistor, the frontside can be located on a first side of a bottom dielectric isolation layer, while the backside can be located on a second side of the bottom dielectric isolation layer that is opposite the first side.

Referring first to FIG. 1, there is illustrated a device layout that can be employed in the present application. The device layout includes a plurality of gate structures, GS, which are oriented perpendicular to different active areas, AA. By way of an example, three gate structures, GS, and two active areas, AA, are shown. Gate spacer, i.e., Spacer, is shown along sidewalls of each GS. The illustrated device layout of FIG. 1 includes cut X-X, cut Y1-Y1, and cut Y2-Y2. Cut X-X is through a length-wise direction of one of the active areas, AA, cut Y-Y is through a length-wise direction of one of the gate structures, GS, and cut Y1-Y1 is located in between two neighboring gate structures, GS, and it passes through source/drain (S/D) regions of the two neighboring gate structures, GS.

Figure 2A:
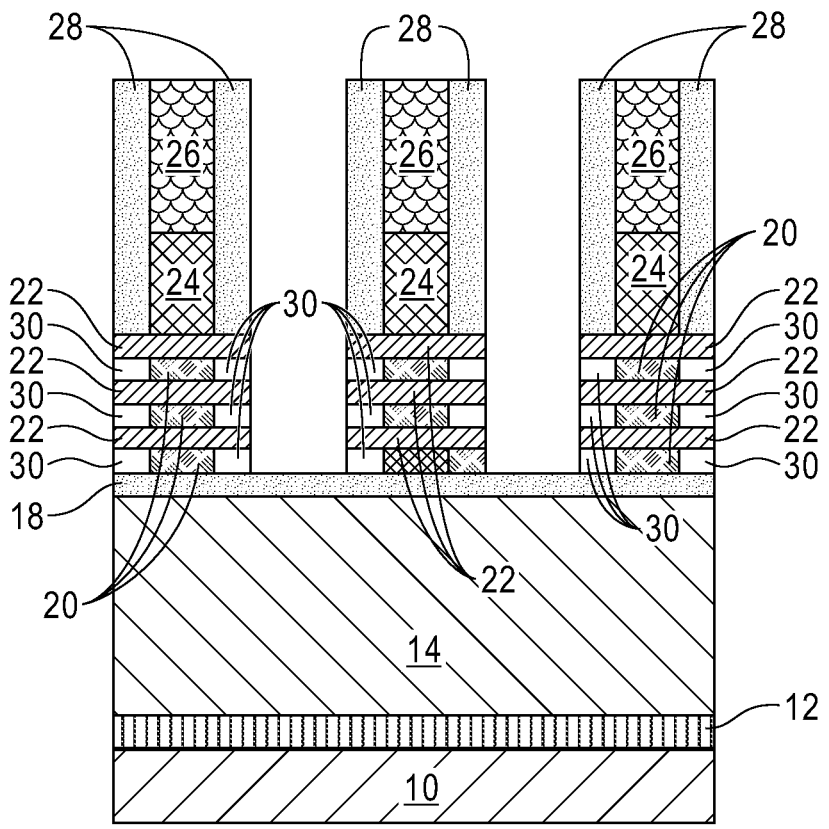
FIGS. 2A, 2B and 2C are cross sectional views through cuts X-X, Y1-Y1, and Y2-Y2 respectively, of an exemplary semiconductor structure that can be employed in the present application, the exemplary structure includes a substrate having a plurality of nanosheet material stacks located above the substrate and on a bottom dielectric isolation layer, and a sacrificial gate structure located on, and straddling over, each of the nanosheet material stacks and a gate spacer located on a sidewall of at least the sacrificial gate structure.
Figure 2C:
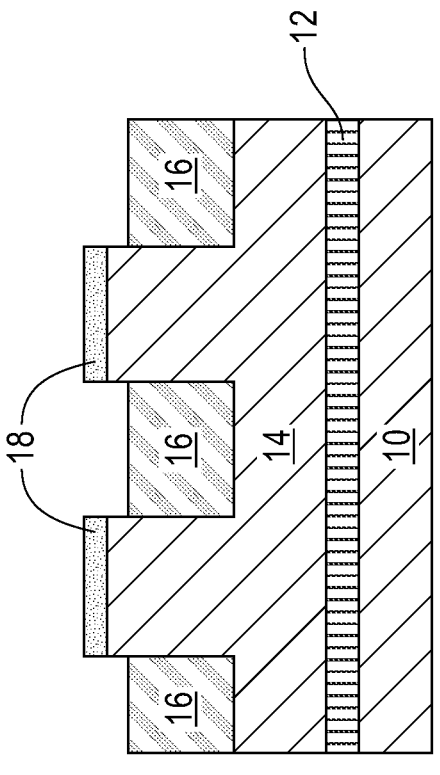
Figure 2C:
Figure 2B:
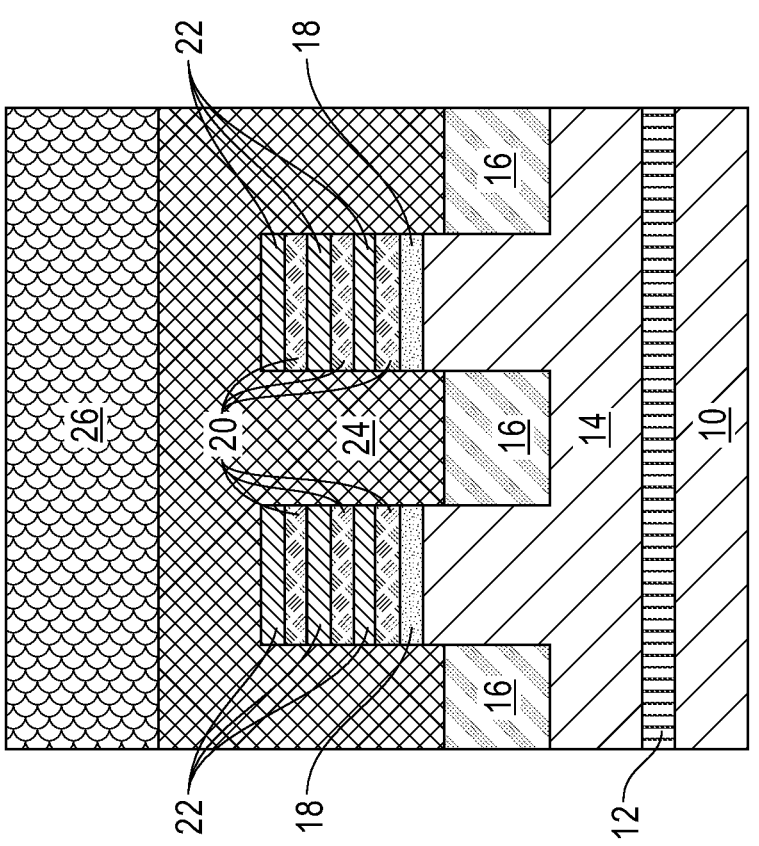

Referring first to FIGS. 2A, 2B and 2C, there are illustrated an exemplary semiconductor structure that can be employed in the present application; FIG. 2A is a cross sectional view through cut X-X shown in FIG. 1, FIG. 2B is a cross sectional view through cut Y-Y shown in FIG. 1 and FIG. 2C is a cross sectional view through cut Y1-Y1 shown in FIG. 1. The illustrated structure shown in FIGS. 2A-2C includes a substrate (10/12/14) having a plurality of nanosheet material stacks (20/22) located above the substrate (10/12/14) and on a bottom dielectric isolation layer 18. The illustrated structure further includes a sacrificial gate structure 24 located on, and straddling over, each of the nanosheet material stacks (20/22), a gate spacer 28 located on a sidewall of at least the sacrificial gate structure 24, and a sacrificial gate cap 26 located on the sacrificial gate structure 24. Inner spacers 30 are also present in the illustrated structure. The sacrificial gate cap 26 is optional. However in embodiments in which the sacrificial gate cap 26 is present the gate spacer 28 is present along the sidewalls of both the sacrificial gate structure 24 and the sacrificial gate cap 26. In embodiments, a shallow trench isolation structure 16 can be present in the substrate (10/12/14).

The semiconductor structure illustrated in FIGS. 2A-2C can be formed utilizing various nanosheet processing steps that are well known to those skilled in the art. The nanosheet processing steps can include, for example, various deposition and patterning steps. The depositions can include, but are not limited, chemical vapor deposition (CVD), plasma enhanced chemical vapor deposition (PECVD), physical vapor deposition (PVD), and atomic layer deposition (ALD). In some embodiments, an epitaxial growth process can be used to form the semiconductor materials that provide the nanosheet material stacks (20/22). Patterning can include lithography and etching (dry etching and/or chemical wet etching). Dry etching can include, for example, reactive ion etching (RIE), ion beam etching (IBE), and plasma etching. Chemical wet etching includes the use of an appropriate chemical etchant that has a high etch rate for one material as compared to at least one another material. So as not to obscure the method of the present application, the processing steps used in providing the structure shown in FIGS. 2A-2C have been omitted from this application. Each of the elements/components of the structure illustrated in FIGS. 2A-2C will now be described in greater detail.

In some embodiments, and as illustrated in FIGS. 2A-2C, the substrate can include a first semiconductor layer 10, an etch stop layer 12 and a second semiconductor layer 14. In other embodiments, the etch stop layer 12 and the second semiconductor layer 14 can be omitted and in such embodiments, the substrate is composed of the first semiconductor layer 10. In yet other embodiments, the etch stop layer 12 can be omitted and in such embodiments, the substrate is composed of the first semiconductor layer 10 and the second semiconductor layer 14 (in such embodiments the semiconductor material that provides the first and second semiconductor layers 10, 14 are compositionally different from each other).

The first semiconductor layer 10 is composed of a first semiconductor material. The second semiconductor layer 14 is composed of a second semiconductor material. The term "semiconductor material" is used throughout the present application to denote a material having semiconducting properties. Examples of semiconductor materials that can be used in the present application in providing the first semiconductor material and the second semiconductor material include, but are not limited to, silicon (Si), a silicon germanium (SiGe) alloy, a silicon germanium carbide (SiGeC) alloy, germanium (Ge), III/V compound semiconductors or II/VI compound semiconductors. The second semiconductor material that provides the second semiconductor layer 14 can be compositionally the same as, or compositionally different from, the first semiconductor material that provides the first semiconductor layer 10. In some embodiments of the present application, the etch stop layer 12 can be composed of a dielectric material such as, for example, silicon dioxide and/or boron nitride. In other embodiments of the present application, the etch stop layer 12 is composed of a third semiconductor material that is compositionally different from the first semiconductor material that provides the first semiconductor layer 10 and the second semiconductor material that provides the second semiconductor layer 14. In one example, the first semiconductor layer 10 is composed of silicon, the etch stop layer 12 is composed of silicon dioxide, and the second semiconductor layer 14 is composed of silicon. In another example, the first semiconductor layer 10 is composed of silicon, the etch stop layer 12 is composed of silicon germanium, and the second semiconductor layer 14 is composed of silicon.

The substrate including the first semiconductor layer 10, the etch stop layer 12 and the second semiconductor layer 14 can be formed utilizing techniques well known to those skilled in the art.

The shallow trench isolation structure 16 can be formed into the substrate; in the illustrated embodiment the shallow trench isolation structure 16 is formed into the second semiconductor layer 14. The shallow trench isolation structure 16 is composed of any trench dielectric material such as, for example, silicon oxide. In some embodiments, a trench dielectric liner composed of, for example, SiN, can be present along a sidewall and a bottom wall of the trench dielectric material. The shallow trench isolation structure 16 can have a topmost surface that is coplanar with a topmost surface of the non-etched portion of the substrate; in the illustrated embodiment the shallow trench isolation structure 16 can have a topmost surface that is coplanar with a topmost surface of the non-etched portion of the second semiconductor layer 14.

The bottom dielectric isolation layer 18 is composed of a dielectric spacer material including, but not limited to, silicon dioxide, SiN, SiBCN, SiOCN or SiOC. The gate spacer 28 is composed of the same dielectric spacer material as the bottom dielectric isolation layer 18 since the gate spacer 28 and the bottom dielectric isolation layer 18 are formed at the same time.

Each nanosheet material stack that is illustrated in FIGS. 2A and 2B is composed of alternating sacrificial semiconductor material nanosheets 20 and semiconductor channel material nanosheets 22. In some embodiments and as is illustrated in FIGS. 2A and 2B, there is an equal number of sacrificial semiconductor material nanosheets 20 and semiconductor channel material nanosheets 22. That is, the material stack can include 'n' number of semiconductor channel material nanosheets 22 and 'n' number of sacrificial semiconductor material nanosheets 20, wherein n is an integer starting from one. By way of one example, each nanosheet material stack includes three sacrificial semiconductor material nanosheets 20 and three semiconductor channel material nanosheets 22. Each sacrificial semiconductor material nanosheet 20 is composed of a fourth semiconductor material, while each semiconductor channel material nanosheet 22 is composed of a fifth semiconductor material that is compositionally different from the fourth semiconductor material.

The fourth semiconductor material that provides each sacrificial semiconductor material nanosheet 20, and the fifth semiconductor material that provides each semiconductor channel material nanosheet 22 can include one of the semiconductor materials mentioned above. In one example, each sacrificial semiconductor material nanosheet 20 is composed of a silicon germanium alloy having a germanium content from 20 atomic percent to 40 atomic percent, and each semiconductor channel material nanosheet 22 is composed of silicon. Other combinations of semiconductor materials are possible as long as the fourth semiconductor material that provides each sacrificial semiconductor material nanosheet 20 is compositionally different from the fifth semiconductor material that provides each semiconductor channel material nanosheet 22. In some embodiments, the fifth semiconductor material that provides each semiconductor channel material nanosheet 22 is capable of providing high channel mobility for n-type field effect transistor (FET) devices. In other embodiments, the fifth semiconductor material that provides each semiconductor channel material nanosheet 22 is capable of providing high channel mobility for p-type FET devices.

Each sacrificial semiconductor material nanosheet 20 can have a first thickness, and each semiconductor channel material nanosheet 22 can have a second thickness. In the present application, the first thickness can be equal to, greater than, or less than, the second thickness. As is illustrated in FIGS. 2A and 2B, each sacrificial semiconductor material nanosheet 20 has a reduced length as compared to the length of each semiconductor channel material nanosheet 22.

The sacrificial gate structure 24 includes at least a sacrificial gate material. In some embodiments, the sacrificial gate structure 24 can also include a sacrificial gate dielectric material. In such embodiments, the sacrificial gate dielectric material would be located beneath the sacrificial gate material. The optional sacrificial gate dielectric material can be composed of a dielectric material such as, for example, silicon dioxide. The sacrificial gate material can be composed of, for example, polysilicon, amorphous silicon, amorphous silicon germanium or amorphous germanium.

The sacrificial gate cap 26 that is located on the sacrificial gate structure 24 is composed of a hard mask material such as, for example, silicon nitride. In some embodiments, the sacrificial gate cap 26 can be omitted from on top of the sacrificial gate structure 24.

The inner spacer 30 is located along the sidewalls of each of the sacrificial semiconductor material nanosheets 20. Each inner spacer 30 is composed of one of dielectric spacer materials mentioned above for the gate spacer 28 and bottom dielectric isolation layer 18. The dielectric spacer material that provides each inner spacer 30 can be compositionally the same as, or compositionally different from, the dielectric material that provides the gate spacer 28 and the bottom dielectric isolation layer 18.

Figure 3A:
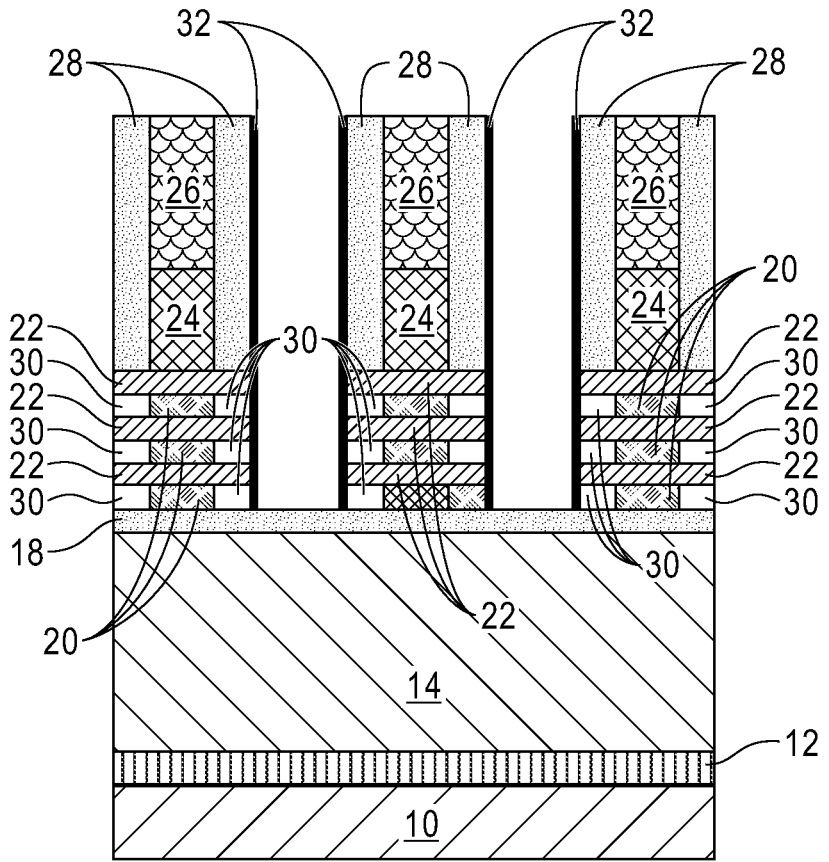
FIGS. 3A, 3B and 3C are cross sectional views of the exemplary semiconductor structure shown in FIGS. 2A, 2B and 2C, respectively, after forming a protective liner on a sidewall of at least the gate spacer and laterally adjacent to each of the nanosheet material stacks.
Figure 3C:
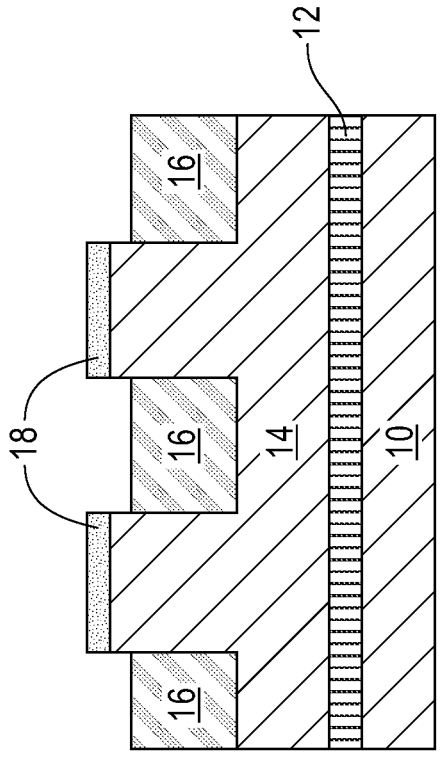
Figure 3B:
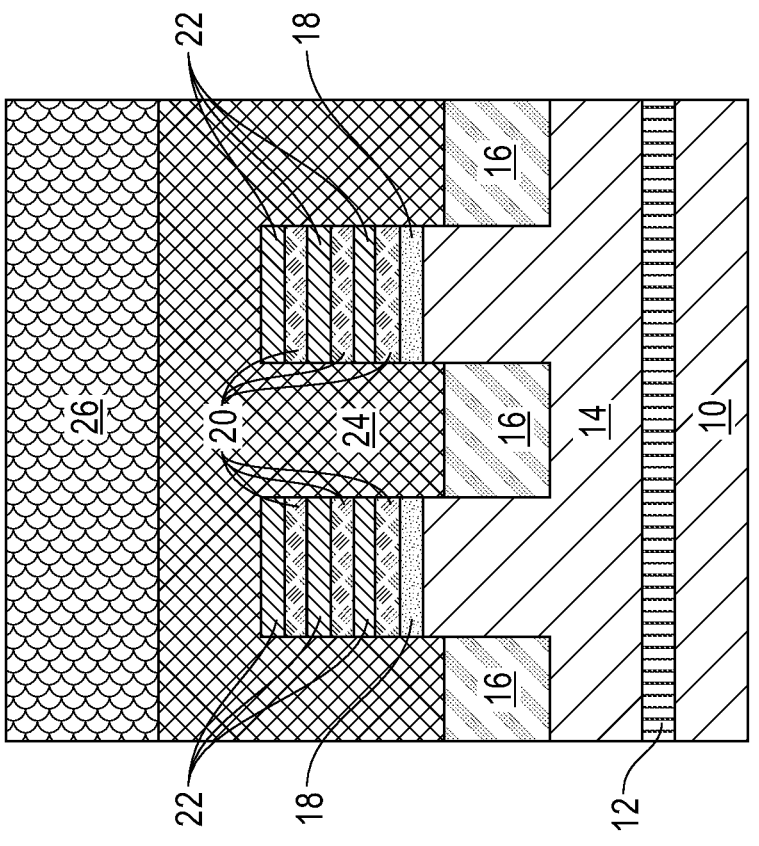

Referring now to FIGS. 3A, 3B and 3C, there are illustrated the exemplary semiconductor structure shown in FIGS. 2A, 2B and 2C, respectively, after forming a protective liner 32 on a sidewall of at least the gate spacer 28 and laterally adjacent to each of the nanosheet material stacks (20/22) and inner spacer 30. The protective liner 32 is composed of a dielectric material that is compositionally the same as, or compositionally different from, the dielectric material that provides the gate spacer 28, inner spacer 30 and bottom dielectric isolation layer 18. In one example, the protective liner 32 is composed of $AlO_x$, $TiO_x$, SiN or $HfO_2$. The protective liner 32 is formed by depositing a layer of dielectric material, and then removing the layer of dielectric material from all horizontal surfaces of the structure utilizing a directional etch. The depositing can include, for example, CVD, PECVD or ALD. The directional etch physically exposes portions of the bottom dielectric isolation layer 18 that are not protected by the sacrificial gate structure 24, the nanosheet material stack (20/22), the gate spacer 28, the inner spacer 30 and the protective liner 32.

Figure 4A:
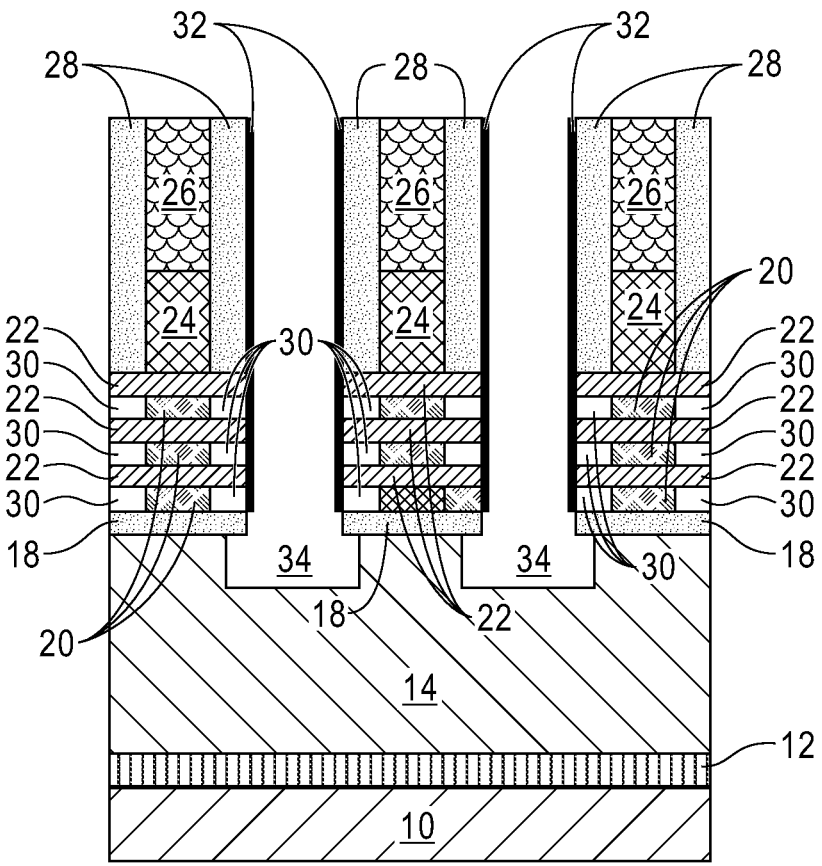
FIGS. 4A, 4B and 4C are cross sectional views of the exemplary semiconductor structure shown in FIGS. 3A, 3B and 3C, respectively, after first etching through physically exposed portions of the bottom dielectric isolation layer, second etching into an upper portion of the substrate and then performing a lateral etch so as to form cavities in the upper portion of the substrate.
Figure 4C:
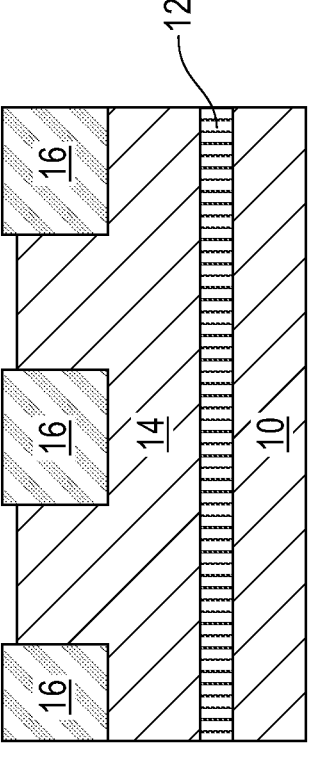
Figure 4B:
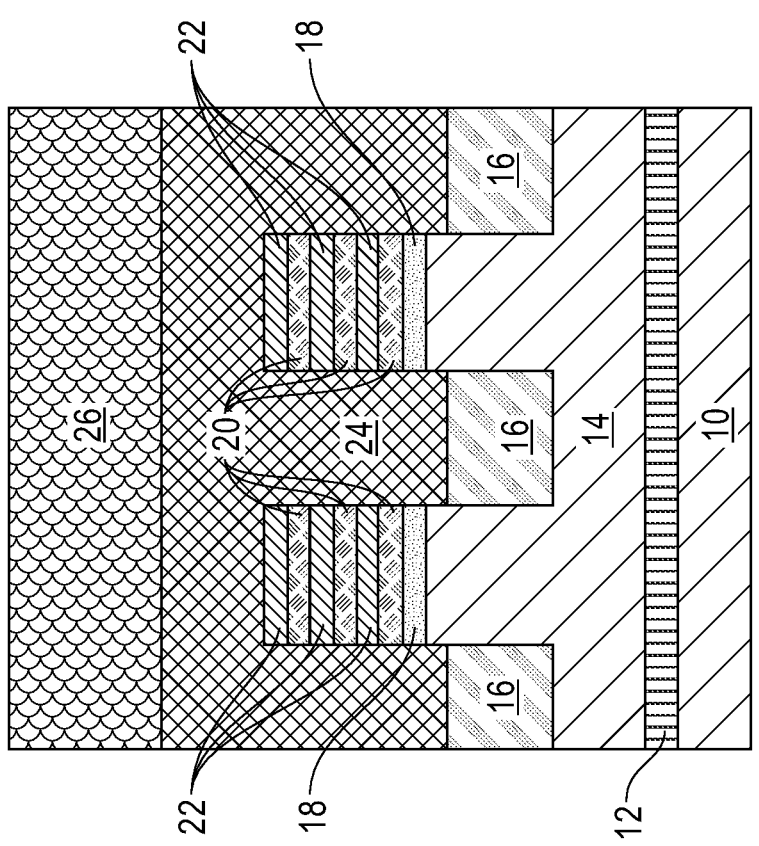

Referring now to FIGS. 4A, 4B and 4C, there are illustrated the exemplary semiconductor structure shown in FIGS. 3A, 3B and 3C, respectively, after first etching through physically exposed portions of the bottom dielectric isolation layer 18, second etching into an upper portion of the substrate (10/12/14) and then performing a lateral etch so as to form cavities 34 in the upper portion of the substrate (10/12/14). In the illustrated embodiment shown in FIG. 4A, the cavities 34 are formed into the second semiconductor layer 14 of the substrate.

The first etch includes an etch that is selective in removing the physically exposed portions of the bottom dielectric isolation layer 18. This first etch can include, for example, a RIE. This first etch opens the bottom dielectric isolation layer 18 and physically exposes an upper portion(s) of the substrate (10/12/14). In the illustrated embodiment of the present application, this first etch physically exposes portions of the second semiconductor layer 14 of the substrate (10/12/14).

The second etch includes an etch that is selective in removing the physically exposed upper exposed portion(s) of substrate (10/12/14). This second etch can include, for example, a timed RIE process. This second etch physically exposes a semiconductor sub-surface of the substrate (10/12/14). Notably, and in the illustrated embodiment, the second etch physically exposes a semiconductor subsurface of the second semiconductor layer 14. In some embodiments, the first etch and second etch can be combined into a single etch.

The lateral etch that forms cavities 34 in the upper portion of the substrate (10/12/14), e.g., the second semiconductor layer 14, can include, for example, a Si etching process. The cavities 34 can extend beneath a remaining portion of the bottom dielectric isolation layer 18 such that an overhang area (evident in FIG. 4A) exists. The overhand area can be located between an outermost sidewall and an innermost sidewall of the gate spacer 28 and the inner spacer 30.

Figure 5A:
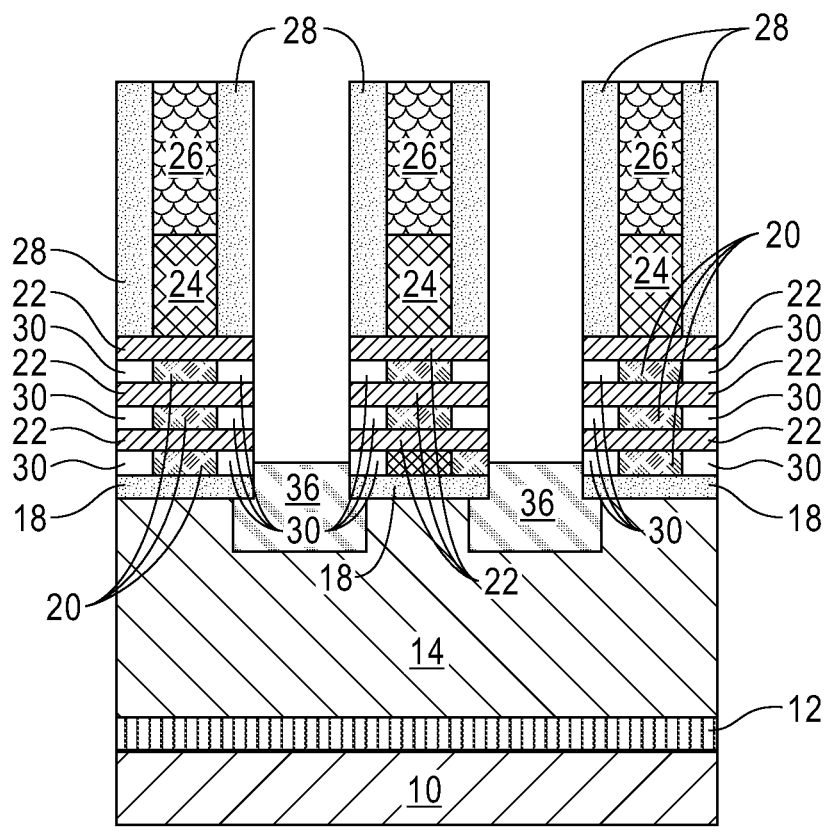
FIGS. 5A, 5B and 5C are cross sectional views of the exemplary semiconductor structure shown in FIGS. 4A, 4B and 4C, respectively, after removing the protective liner from the structure and forming a dielectric structure into each of the cavities.
Figure 5C:
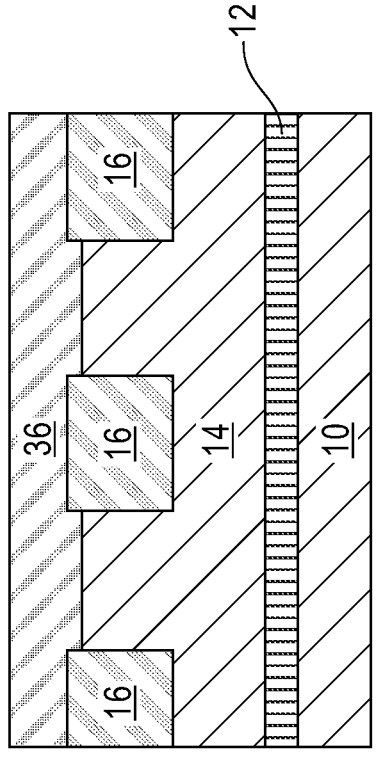
Figure 5B:
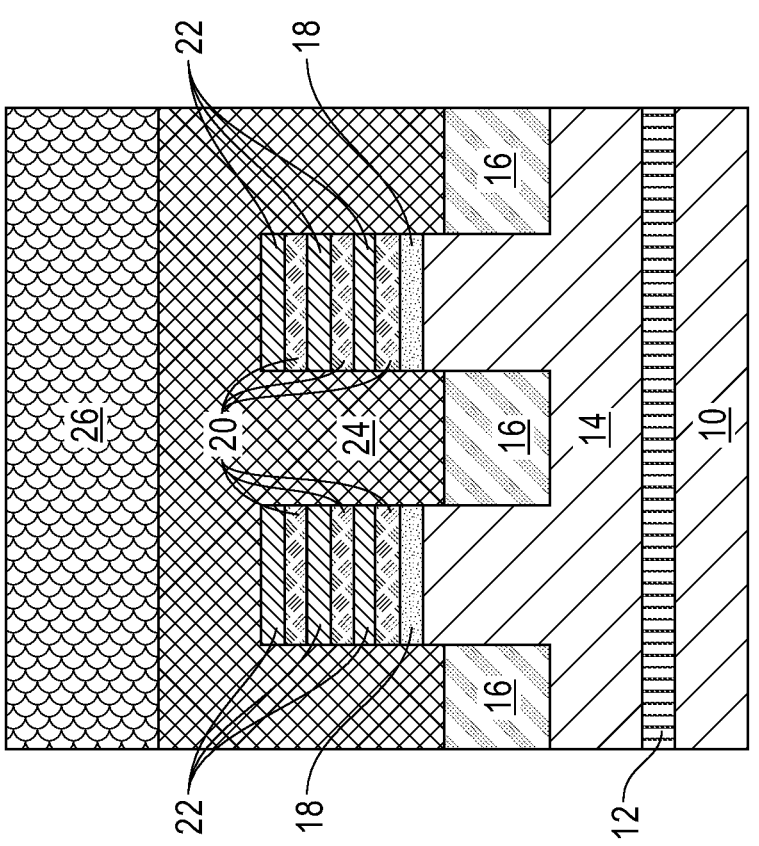

Referring now to FIGS. 5A, 5B and 5C, there are illustrated the exemplary semiconductor structure shown in FIGS. 4A, 4B and 4C, respectively, after removing the protective liner 32 from the structure and forming a dielectric structure 36 into each of the cavities 34. The protective liner 32 can be removed utilizing an etching process that is selective for removing the material of the protective liner 32. This etch does not however remove any portion of the bottom dielectric isolation layer 18, the gate spacer 28, the inner spacer 30 or the semiconductor channel material nanosheets 22. The dielectric structure 36 can be composed of a dielectric material that is compositionally different from the dielectric material that provides the bottom dielectric isolation layer 18, the gate spacer 28, and the inner spacer 30. Illustrative examples of dielectric materials that can be used in providing the dielectric structure 36 include, but are not limited to, SiC, SiOC or $AlO_x$. The dielectric structure 36 can be formed by first depositing the dielectric material filling each of the cavities 34 and thereafter performing a recess etch so as to reduce the height of the deposited dielectric material. Typically, the dielectric structure 36 has a height that does not extend above the height of the lowest sacrificial semiconductor material nanosheet 20 of each nanosheet material stack; thus sidewalls of each of the semiconductor channel material nanosheets 22 of the nanosheet material stacks are physically exposed. As is shown in FIG. 5C, the dielectric structure 36 is formed on a topmost surface of the shallow trench isolation structure 16 as well as between an upper portion of neighboring shallow trench isolation structures 16. Dielectric structure 36 is present in both the frontside and backside of the illustrated structure.

Figure 6A:
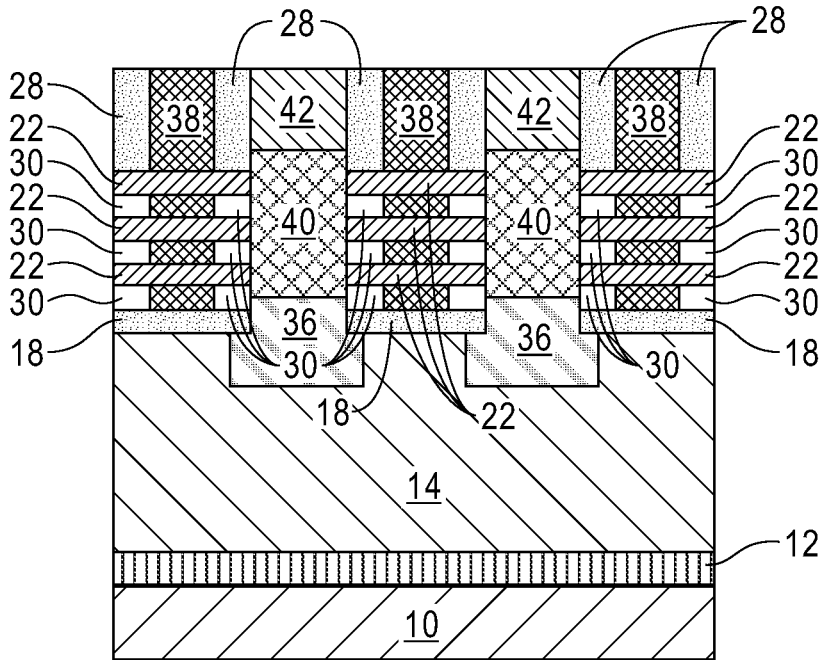
FIGS. 6A, 6B and 6C are cross sectional views of the exemplary semiconductor structure shown in FIGS. 5A, 5B and 5C, respectively, after performing nanosheet device processing steps including forming source/drain regions, forming a frontside interlayer dielectric (ILD) layer, removing the sacrificial gate structures, removing each sacrificial semiconductor material nanosheet from the nanosheet material stacks so as to suspend each semiconductor channel material nanosheet of the nanosheet material stacks, forming gates structures, and forming at least one gate cut region.
Figure 6C:
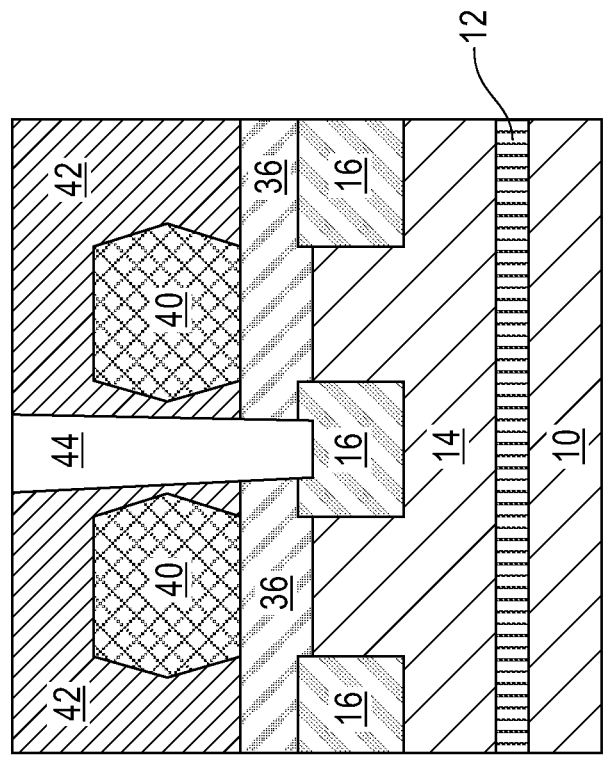
Figure 6B:
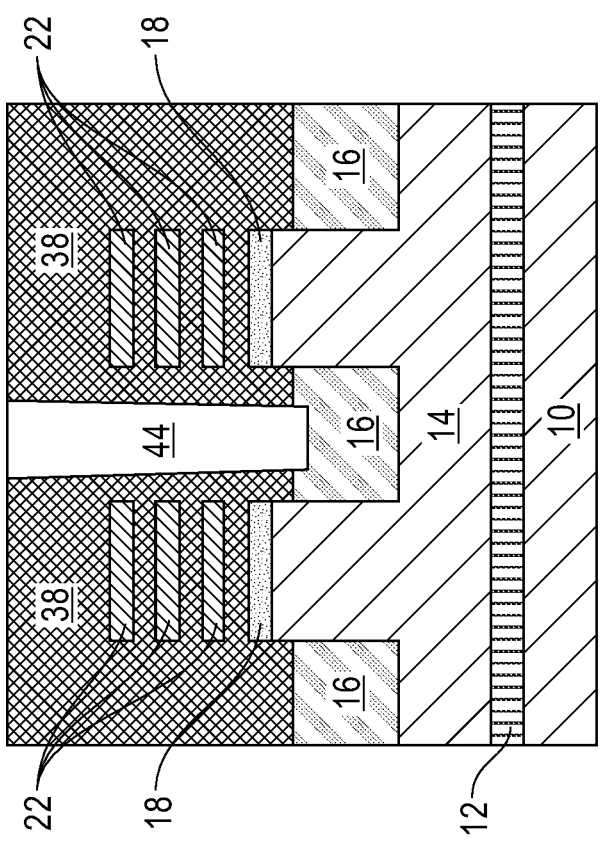

Referring now to FIGS. 6A, 6B and 6C, there are illustrated the exemplary semiconductor structure shown in FIGS. 5A, 5B and 5C, respectively, after performing nanosheet device processing steps including forming source/drain regions 40, forming a frontside interlayer dielectric (ILD) layer 42, removing the sacrificial gate structures 24, removing the sacrificial semiconductor material nanosheets 20 from each of the nanosheet material stacks so as to suspend each semiconductor channel material nanosheet 22 of each of the nanosheet material stacks, forming gates structures 38, and forming at least one gate cut region 44. Forming the cut gate region 44 is optional in some embodiments of the present application.

The source/drain regions 40 are typically formed by an epitaxial growth process. Throughout the present application, the terms "epitaxial growth" or "epitaxially growing" mean the growth of a semiconductor material on a growth surface of another semiconductor material, in which the semiconductor material being grown has the same crystalline characteristics as the growth surface of the another semiconductor material. In an epitaxial deposition process, the chemical reactants provided by the source gases are controlled and the system parameters are set so that the depositing atoms arrive at the growth surface of the another semiconductor material with sufficient energy to move around on the growth surface and orient themselves to the crystal arrangement of the atoms of the growth surface. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking.

The source/drain regions 40 extend outward from a sidewall of each semiconductor channel material nanosheet 22. The source/drain regions 40 are located on an upper surface of the dielectric structure 36. Each of the source/drain regions 40 is composed of a semiconductor material and a dopant. As used herein, a "source/drain" region can be a source region or a drain region depending on subsequent wiring and application of voltages during operation of the transistor. The semiconductor material that provides each of the source/drain regions 40 is composed of one of the semiconductor materials mentioned above for the first semiconductor layer 10. The semiconductor material that provides the source/drain regions 40 can be compositionally the same, or compositionally different from each semiconductor channel material nanosheet 22. The semiconductor material that provides each source/drain region 40 is however compositionally different from each sacrificial semiconductor material nanosheet 20. The dopant that is present in the source/drain regions 40 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, phosphorus and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, each of the source/drain regions 40 can have a dopant concentration of from $4 \times 10^{20}$ atoms/cm$^3$ to $3 \times 10^{21}$ atoms/cm$^3$.

The frontside ILD layer 42 is composed of a dielectric material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0 (all dielectric constants mentioned herein are relative to a vacuum unless otherwise noted). The frontside ILD layer 42 can be formed by a deposition process including, but not limited to, CVD, PECVD or spin-on coating. A planarization process such as, for example, chemical mechanical polishing (CMP) follows the deposition process. The planarization process removes the sacrificial gate cap 26 (if the same is present) and an upper portion of each gate spacer 28. The sacrificial gate structures 24 are physically exposed after this planarization process has been performed.

The physically exposed sacrificial gate structures 24 are removed utilizing any material removal process such as, for example, etching, which is selective in removing the sacrificial gate structures 24. The removal of the sacrificial gate structures 24 reveals each of the nanosheet material stacks. Next, the sacrificial semiconductor material nanosheets 20 are removed so as to suspend each semiconductor channel material nanosheet 22. The removal of the sacrificial semiconductor material nanosheets 20 includes any material removal process such as, for example, etching, which is selective in removing the sacrificial semiconductor material nanosheets 20.

The gates structures 38 are then formed. The gate structures 38 include a gate dielectric material and a gate electrode, both of which are not separately shown, but intended to be within region defined by the gate structures 38. As is known to those skilled in the art, the gate dielectric material directly contacts a physically exposed surface(s) of each semiconductor channel material nanosheet 22, and the gate electrode is formed on the gate dielectric material. The gate dielectric material has a dielectric constant of 4.0 or greater. Illustrative examples of gate dielectric materials include, but are not limited to, silicon dioxide, hafnium dioxide (HfO$_2$), hafnium silicon oxide (HfSiO), hafnium silicon oxynitride (HfSiO), lanthanum oxide (La$_2$O$_3$), lanthanum aluminum oxide (LaAlO$_3$), zirconium dioxide (ZrO$_2$), zirconium silicon oxide (ZrSiO$_4$), zirconium silicon oxynitride (ZrSiO$_x$N$_y$), tantalum oxide (TaO$_x$), titanium oxide (TiO), barium strontium titanium oxide (BaO$_6$SrTi$_2$), barium titanium oxide (BaTiO$_3$), strontium titanium oxide (SrTiO$_3$), yttrium oxide (Yb$_2$O$_3$), aluminum oxide (Al$_2$O$_3$), lead scandium tantalum oxide (Pb(Sc,Ta)O$_3$), and/or lead zinc niobite (Pb

US 12,690,445 B2

13

(Zn,Nb)O). The gate dielectric material can further include dopants such as lanthanum (La), aluminum (Al) and/or magnesium (Mg).

The gate electrode can include a work function metal (WFM) and optionally a conductive metal. The WFM can be used to set a threshold voltage of the transistor to a desired value. In some embodiments, the WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the WFM can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof. The optional conductive metal can include, but is not limited to aluminum (Al), tungsten (W), or cobalt (Co). The gate structures 38 can be formed by deposition of the gate dielectric material, and gate electrode material, followed by a planarization process. At this point of the present application, the gate structures 38 have a topmost surface that is coplanar with a topmost surface of the frontside ILD layer 42.

Next, the at least one gate cut region 44 is formed. The at least one gate cut region 44 includes a dielectric material pillar that extends upward from a surface of one of the shallow trench isolation structures 16; this dielectric material pillar can cut through the dielectric structure 36 as is shown in FIG. 6C. The dielectric material pillar that provides the at least one gate cut region 44 can be composed of a dielectric material that is compositionally different from the dielectric material that provides dielectric structure 36. For example, the dielectric material pillar that provides the at least one gate cut region 44 can be composed of SiN, SiOCN, SiBCN, or SiO$_2$. The least one gate cut region 44 can be formed by forming a trench opening into one of the gate structures 38 and then filling this trench opening with a dielectric material.

Figure 7A:
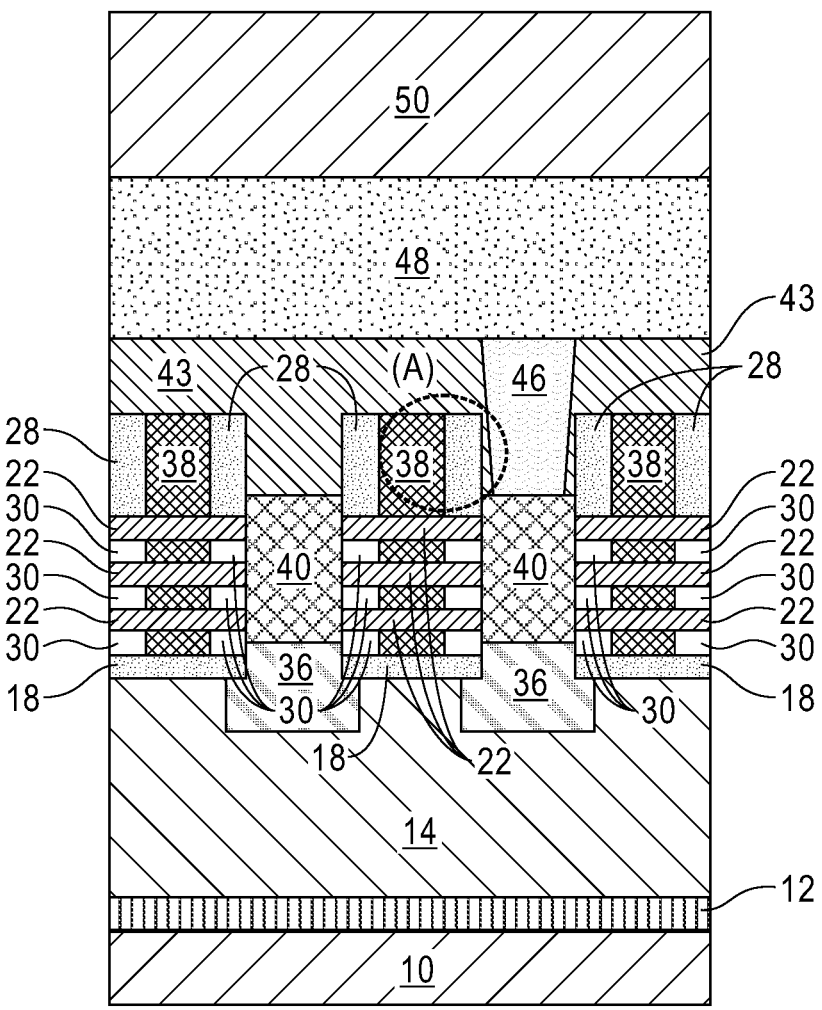
FIGS. 7A, 7B and 7C are cross sectional views of the exemplary semiconductor structure shown in FIGS. 6A, 6B and 6C, respectively, after forming an additional frontside ILD layer, forming frontside contact structures including a frontside source/drain contact structure and a frontside gate contact structure, forming a frontside back-end-of-the-line (BEOL) structure including frontside metal wires, and forming a carrier wafer.
Figures 7B, 7C:
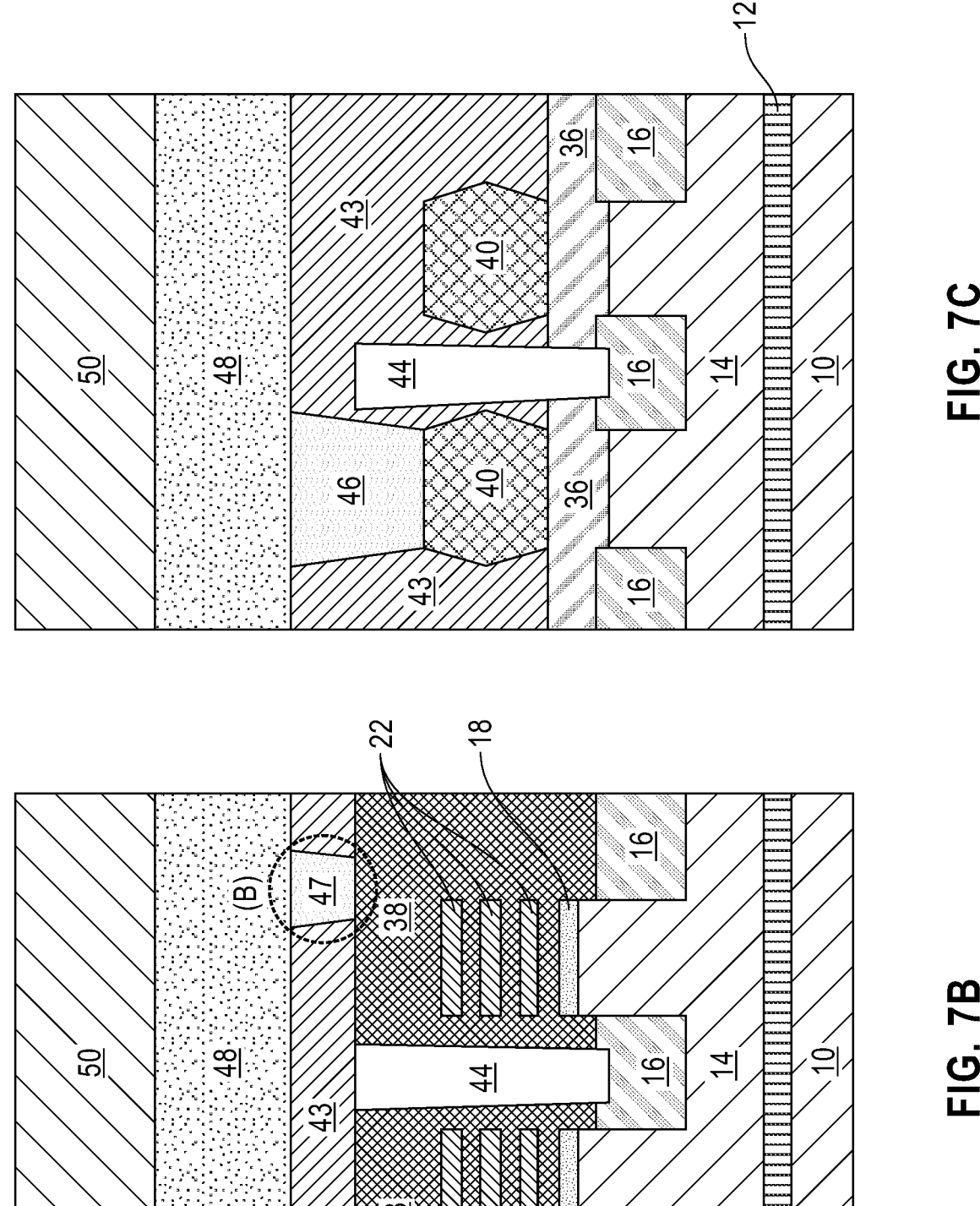

Referring now to FIGS. 7A, 7B and 7C, there are illustrated the exemplary semiconductor structure shown in FIGS. 6A, 6B and 6C, respectively, after forming an additional frontside ILD layer, forming frontside contact structures including a frontside source/drain contact structure 46 and a frontside gate contact structure 47, forming a frontside BEOL structure 48 and forming a carrier wafer 50.

In the present application, the additional frontside ILD layer and the frontside ILD layer 42 provide a middle-of-the-line (MOL) dielectric layer 43. The additional frontside ILD layer can be composed of a dielectric material that is compositionally the same as, or compositionally different from the dielectric material that provides the frontside ILD layer 42. Typically, the dielectric material that provides the additional ILD layer is compositionally the same as the dielectric material that provides the frontside ILD layer 42 such that within the MOL dielectric layer 43 no material interface would exist between the additional frontside ILD layer and the frontside ILD layer 42; such an embodiment is shown in the drawings of the present application. When compositionally different dielectric materials are employed for the additional frontside ILD layer and the frontside ILD layer 42, the MOL dielectric layer 43 would contain a material interface between the two compositionally different dielectric materials. Such an embodiment is not however shown in the drawings of the present application. The additional frontside ILD layer can be formed utilizing one of the deposition processes mentioned above in forming the frontside ILD layer 42.

Frontside contact structures including the frontside source/drain contact structure 46 and the frontside gate contact structure 47 are then formed utilizing a metallization process that includes forming frontside contact openings in the MOL dielectric layer 43, and thereafter filling (including deposition and planarization) each frontside contact opening with at least a contact conductor material. The contact conductor material can include, for example, a silicide liner, such as Ni, Pt, NiPt, an adhesion metal liner, such as TiN, and conductive metals such as W, Cu, Al, Co, Ru, Mo, Os, Ir. Rh, or an alloy thereof. The frontside contact structures can also include one or more contact liners (not shown). In one or more embodiments, the contact liner (not shown) can include a diffusion barrier material. Exemplary diffusion barrier materials include, but are not limited to, Ti, Ta, Ni, Co. Pt, W, Ru, TiN, TaN, WN, WC, an alloy thereof, or a stack thereof such as Ti/TiN and Ti/WC. In one or more embodiments in which a contact liner is present, the contact liner (not shown) can include a silicide liner, such as Ti, Ni, NiPt, etc., and a diffusion barrier material, as defined above. The frontside source/drain contact structures 46 contacts one of the source/drain regions 40, while the frontside gate contact structure 47 contacts one of the gate structures 38. Each frontside structure (46, 47) has a topmost surface that is coplanar with a topmost surface of the MOL dielectric layer 43. The frontside source/drain contact structure 46, the frontside gate contact structure 47 and frontside MOL dielectric layer 43 represent a MOL level that is located on a frontside of the illustrated structure.

In the present application, and in region (A) shown in FIG. 7A, the frontside source/drain contact structure 46 has a large overlap with the gate structure 38, but because the frontside source/drain contact structure 46 wires the source/drain region 40 to the frontside BEOL structure 48, the source/drain contact structure to gate electrode capacitance is no longer a concern.

In the present application, and in region (B) shown in FIG. 7B, it is easier to provide a gate-tie-down for a non-functional gate structure by directly forming frontside gate contact structure 47 in the frontside to wire at least one of the gate structures 38 to the frontside BEOL structure 48.

Next, frontside BEOL structure 48 is formed over the MOL level. The frontside BEOL structure 48 is electrically connected to the source/drain region 40 of one of the gate structures 38 by source/drain contact structure 46 and frontside BEOL structure 48 is also electrically connected to gate structure 38 via frontside gate contact structure 47. The frontside BEOL structure 48 is located directly on a surface of the MOL dielectric layer 43. The frontside BEOL structure 48 can include one or more interconnect dielectric material layers (including one of the dielectric materials mentioned above for the frontside ILD layer 42) that contain frontside metal wires (the metal wires can be composed of any electrically conductive metal or electrically conductive metal alloy) embedded therein. At least 90% of the frontside metal wires are power distribution metal wires; the remainder frontside metal wires which are usually present in metal levels furthest from the transistor, can be used as signal wires. The frontside BEOL structure 48 can include "x" numbers of frontside metal levels, wherein "x" is an integer starting from 1. In the present application, the majority of the power distribution wiring is present in the first two metal levels of the frontside BEOL structure 48. The frontside BEOL structure 48 can be formed utilizing techniques well known to those skilled in the art. In some embodiments, the frontside metal wires within the frontside BEOL structure 48 are composed of Cu. Power distribution wires are less dense signal metal wires. In the present application, at least 90%, typically at least 95% of the frontside metal wires that are present in frontside BEOL structure 48 are used for power distribution.

The frontside BEOL structure 48 has a relaxed metal pitch and via size thus there is a less chance for device failure. As such, less device failure analysis is required in the present application.

The carrier wafer 50 can include one of the semiconductor materials mentioned above for the first semiconductor layer 10. Carrier wafer 50 is bonded to the frontside BEOL structure 48 after frontside BEOL structure 48 formation.

Figure 8:
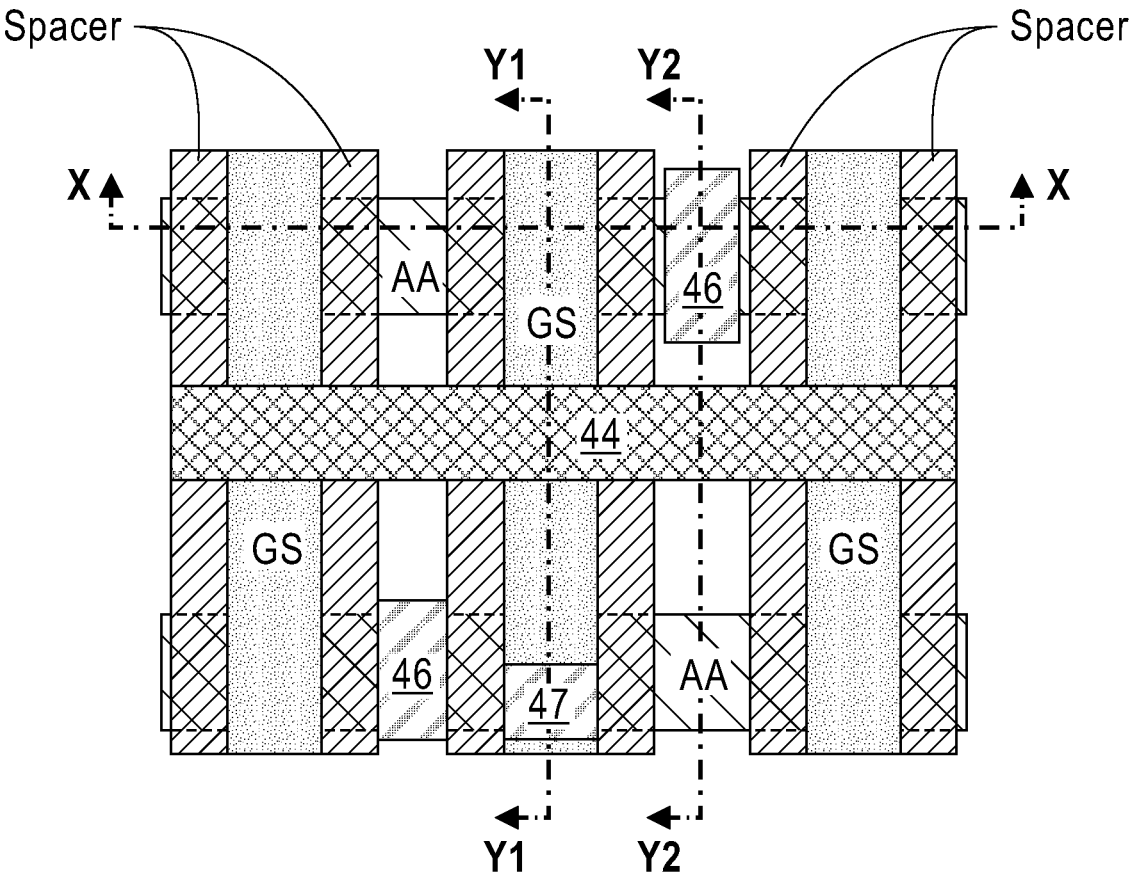
FIG. 8 is a top down view showing the device layout of FIG. 1 showing the location of the frontside source/drain contact structure and the frontside gate contact structure.

Referring now to FIG. 8, there is illustrated the device layout of FIG. 1 showing the location of the frontside source/drain contact structure 46 and the frontside gate contact structure 47. Also, shown is the gate cut region 44 which cuts the gate structure between the two different active areas, AA, of the structure.

Figure 9A:
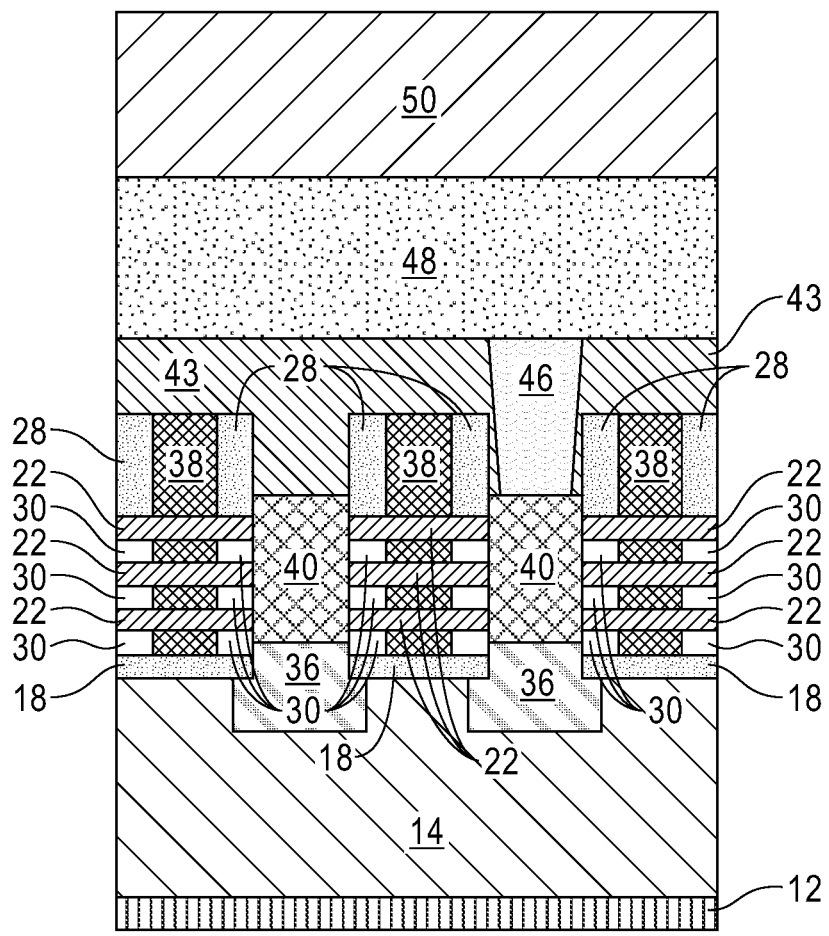
FIGS. 9A, 9B and 9C are cross sectional views of the exemplary semiconductor structure shown in FIGS. 7A, 7B and 7C, respectively, after removing a first semiconductor layer of the substrate and stopping on an etch stop layer of the substrate.
Figure 9C:
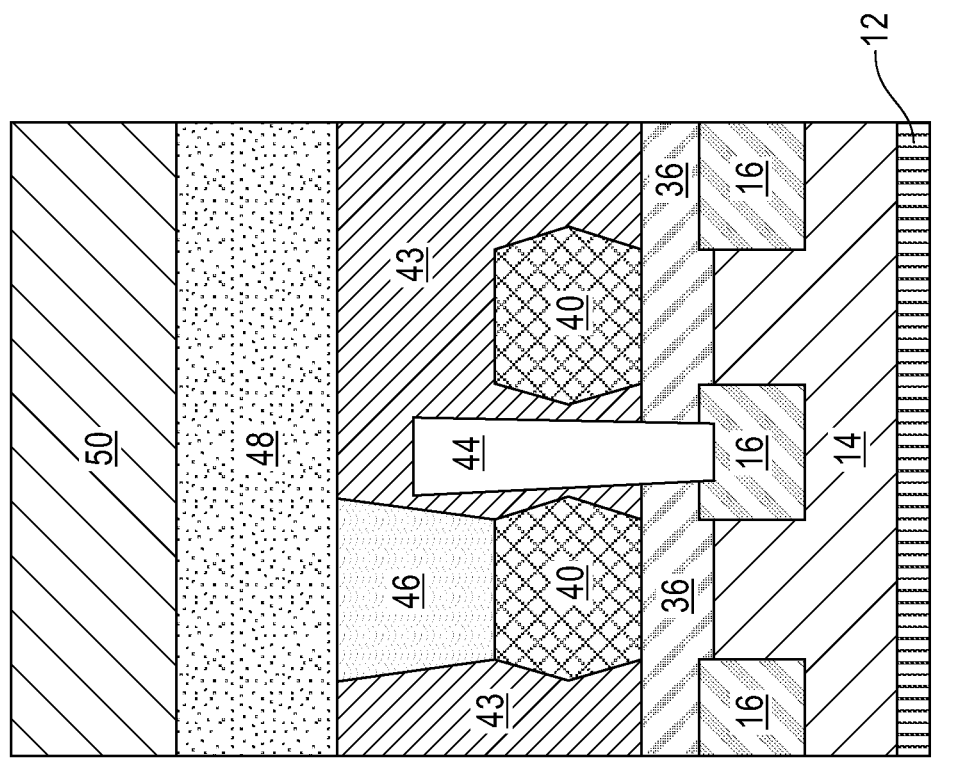
Figure 9B:
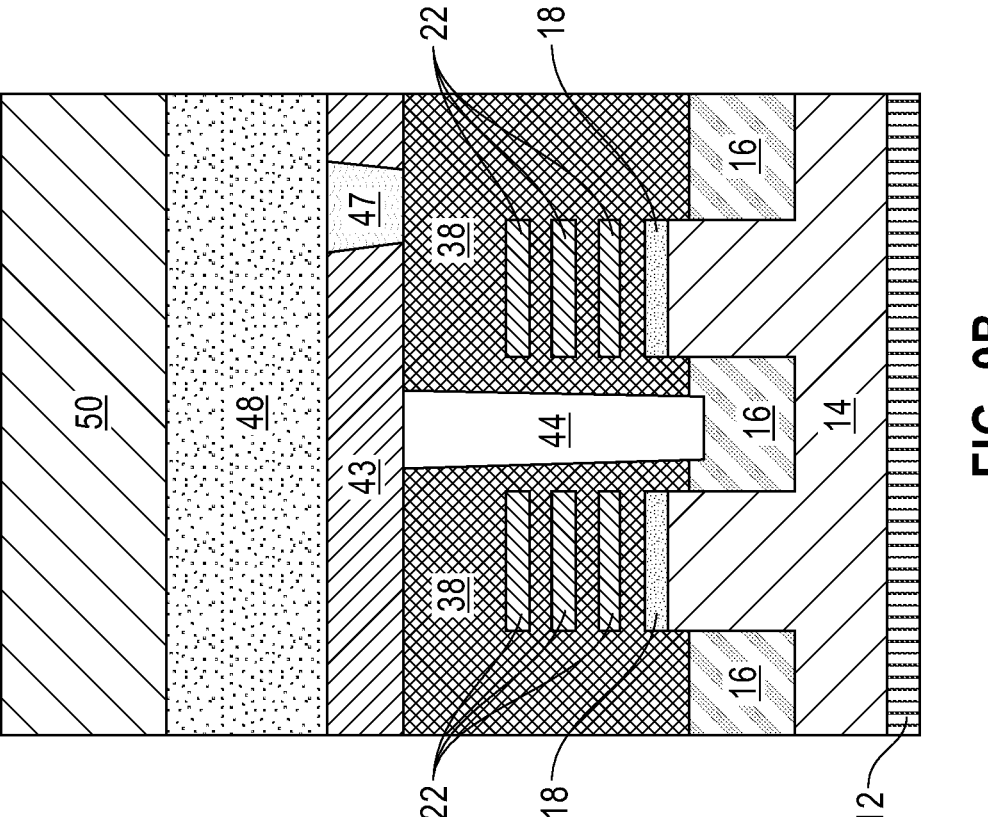

Referring now to FIGS. 9A, 9B and 9C, there are illustrated the exemplary semiconductor structure shown in FIGS. 7A, 7B and 7C, respectively, after removing the first semiconductor layer 10 of the substrate and stopping on an etch stop layer 12 of the substrate. The removal of the first semiconductor layer 10 typically includes flipping the wafer 180° to physically expose a backside of the substrate. This flipping step is not shown in the drawings of the present application for clarity. In the illustrated embodiment, the substrate includes the first semiconductor layer 10, the etch stop layer 12, and the second semiconductor layer 14. Thus, the flipping can physically expose the first semiconductor layer 10 of the substrate. This flipping step will allow backside processing of the exemplary structure. Backside processing occurs on a side of a wafer opposite the side where the transistors, i.e., gate structures 38, have been formed; in the present application the backside of the wafer can be defined as the area of the wafer that is beneath the bottom dielectric isolation layer 18. Flipping of the structure can be performed by hand or by utilizing a mechanical means such as, for example, a robot arm.

The removal of the physically exposed first semiconductor layer 10 of the substrate physically exposes the etch stop layer 12 of the substrate. The removal of the first semiconductor layer 10 of the substrate can be performed utilizing a material removal process that is selective in removing the first semiconductor material that provides the first semiconductor layer 10.

Figure 10A:
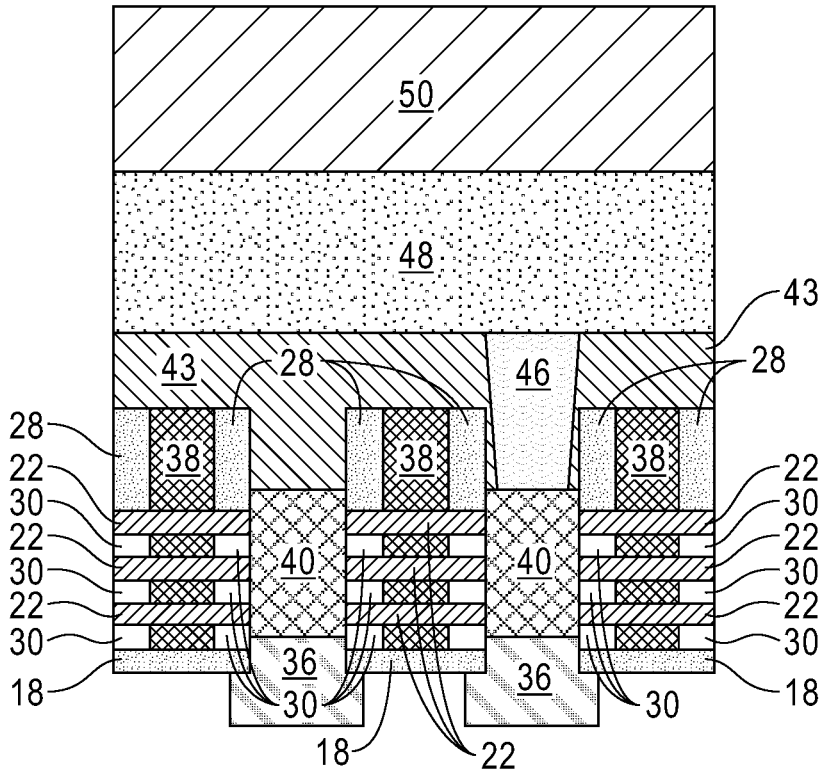
FIGS. 10A, 10B and 10C are cross sectional views of the exemplary semiconductor structure shown in FIGS. 9A, 9B and 9C, respectively, after removing the etch stop layer and a second semiconductor layer of the substrate.
Figures 10B, 10C:
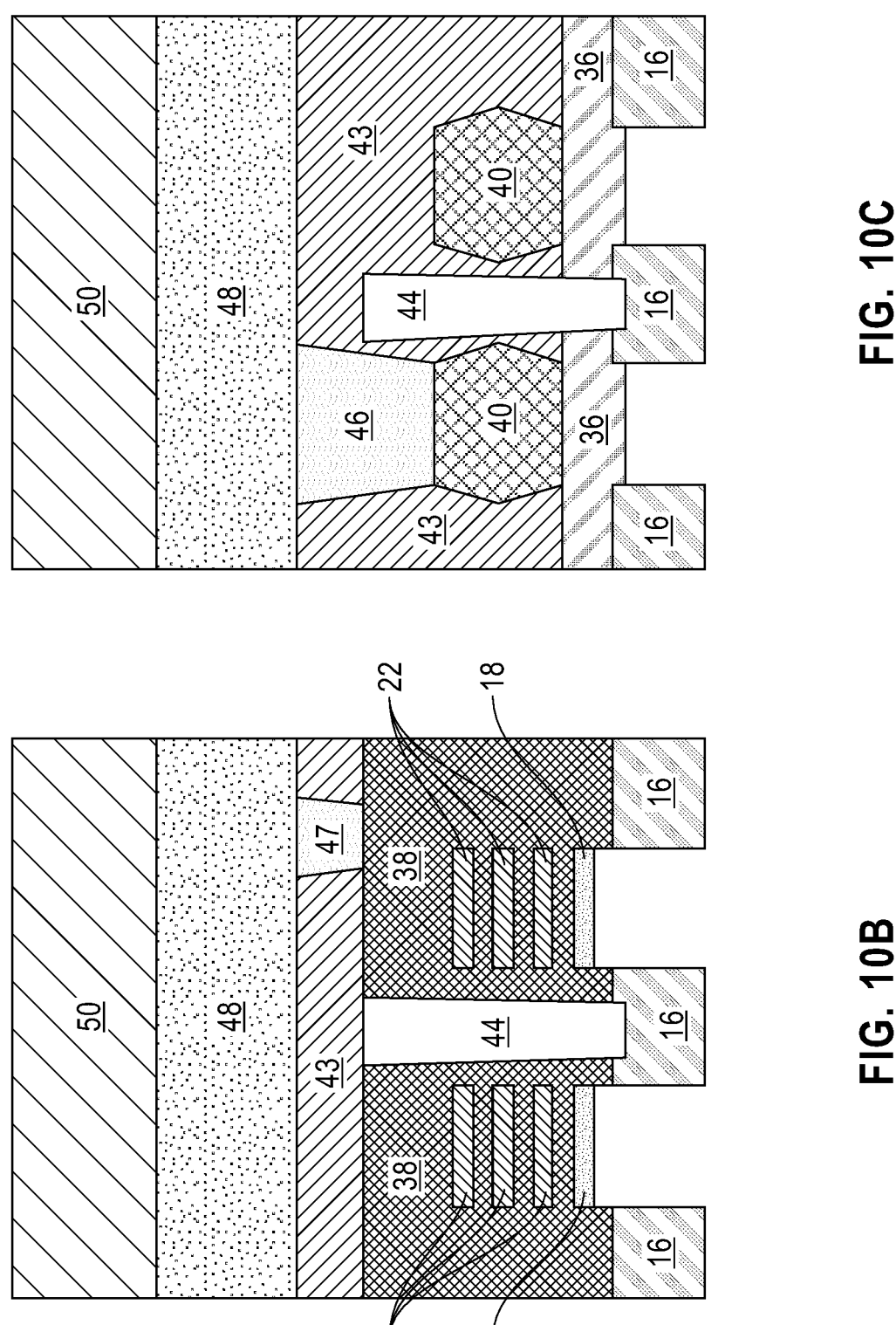

Referring now to FIGS. 10A, 10B and 10C, there are the exemplary semiconductor structure shown in FIGS. 9A, 9B and 9C, respectively, after removing the etch stop layer 12 and the second semiconductor layer 14 of the substrate. The removal of the etch stop layer 12 includes a material removal process that is selective in removing the etch stop layer 12.

The removal of the etch stop layer 12 physically exposes the second semiconductor layer 14 of the substrate. The physically exposed second semiconductor layer 14 of the substrate can be removed utilizing a material removal process that is selective in removing that layer from the structure. Other material removal processes can be used depending on the type of substrate used. For example, in some embodiments in which substrate is a composed entirely of one semiconductor material, one material removal process can be used instead of the multiple material removal processing steps described herein.

Figure 11A:
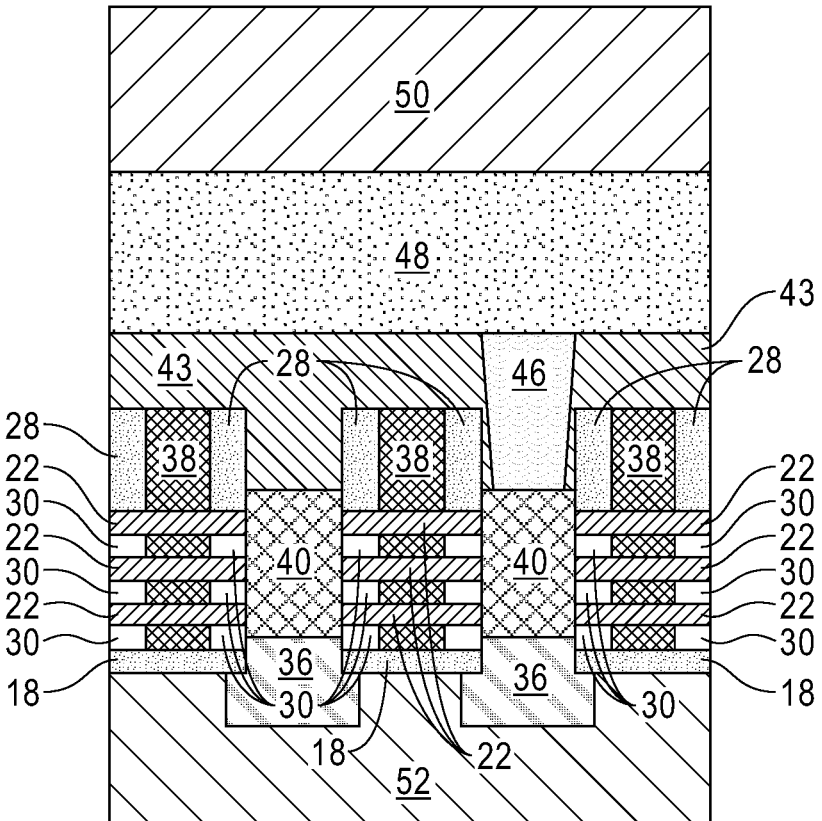
FIGS. 11A, 11B and 11C are cross sectional views of the exemplary semiconductor structure shown in FIGS. 10A, 10B and 10C, respectively, after forming a first backside ILD layer.
Figure 11C:
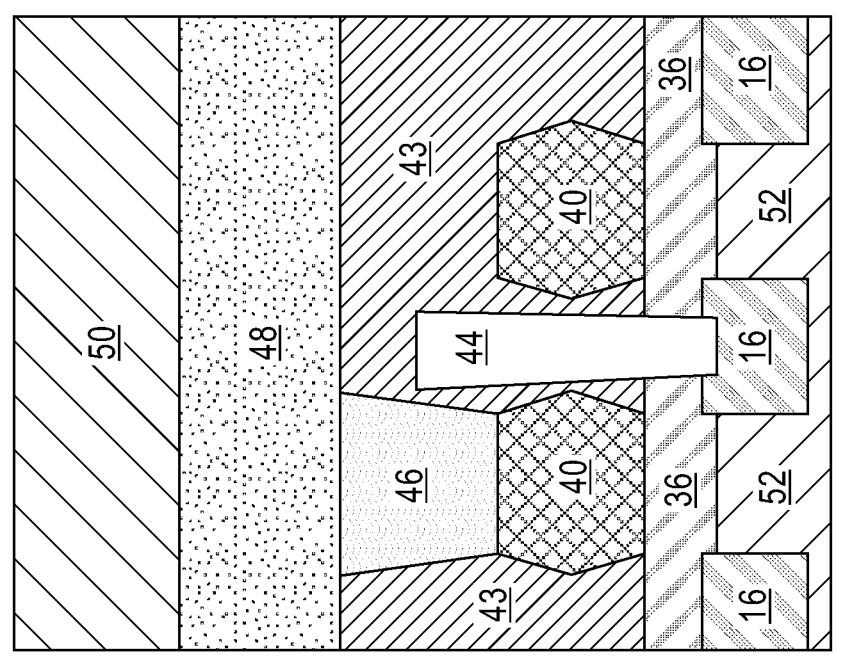
Figure 11B:
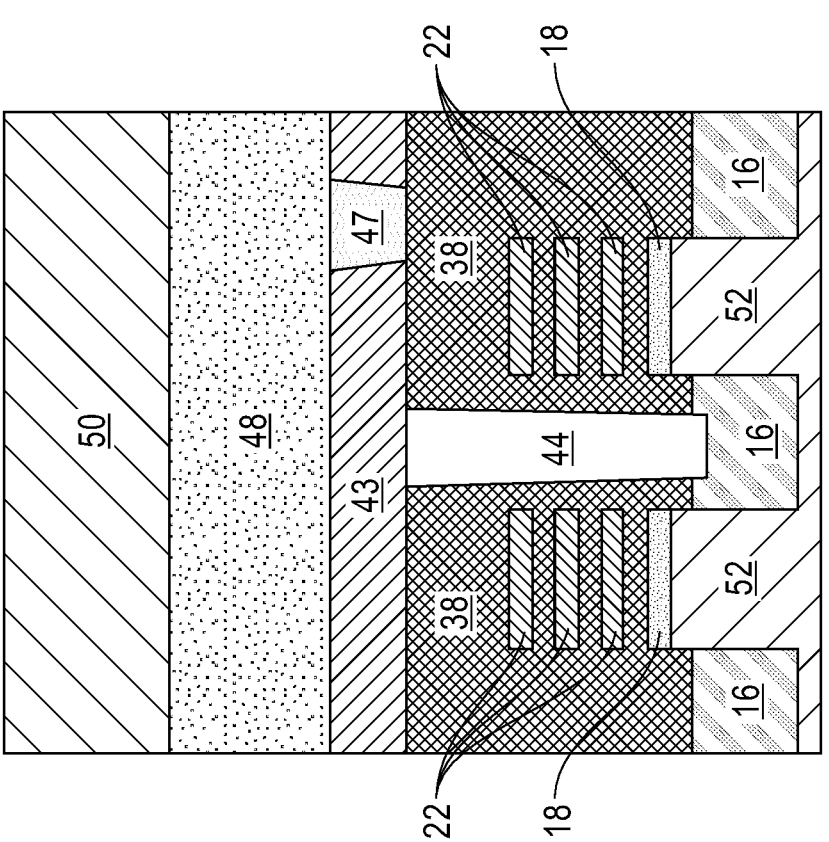

Referring now to FIGS. 11A, 11B and 11C, there are illustrated the exemplary semiconductor structure shown in FIGS. 10A, 10B and 10C, respectively, after forming a first backside ILD layer 52. The first backside ILD layer 52 can include one of the dielectric materials mentioned above for the frontside ILD layer 42. The first backside ILD layer 52 can be formed utilizing one of the deposition processes mentioned above for forming the frontside ILD layer 42. A planarization process can follow the deposition process used in forming the first backside ILD layer 52. The first backside ILD layer 52 contacts the bottom dielectric isolation layer 18 and embeds the shallow trench isolation structures 16 and a portion of the dielectric structure 36.

Figure 12A:
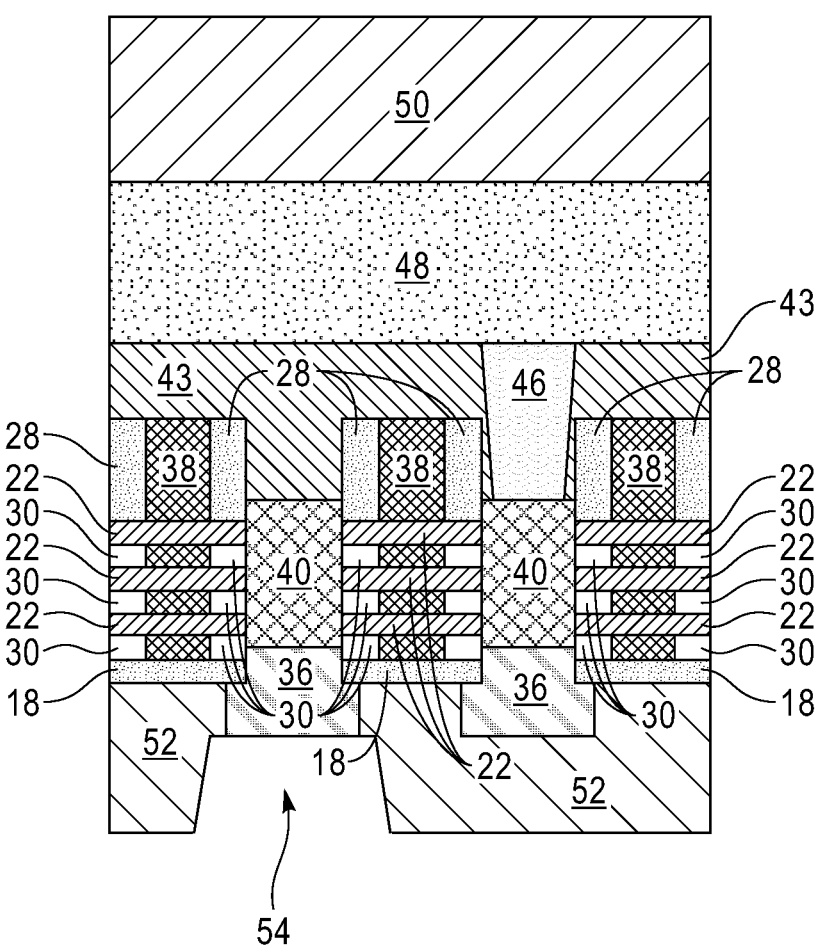
FIGS. 12A, 12B and 12C are cross sectional views of the exemplary semiconductor structure shown in FIGS. 11A, 11B and 11C, respectively, after forming an opening in the first backside ILD layer that physically exposes one of the dielectric structures.
Figure 12C:
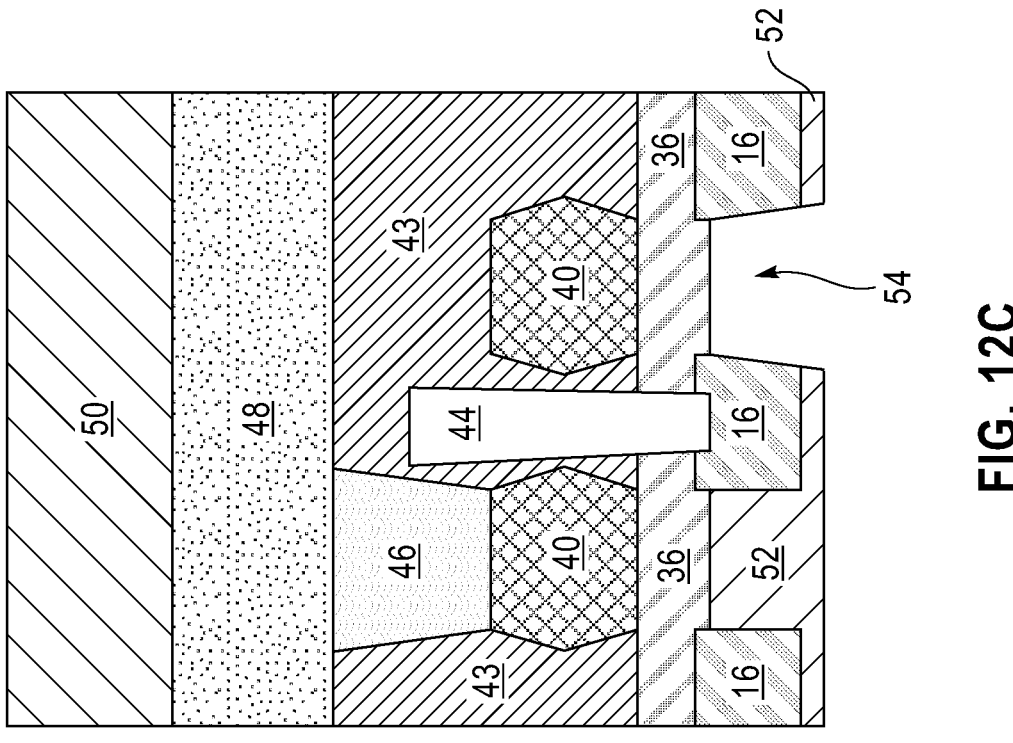
Figure 12B:
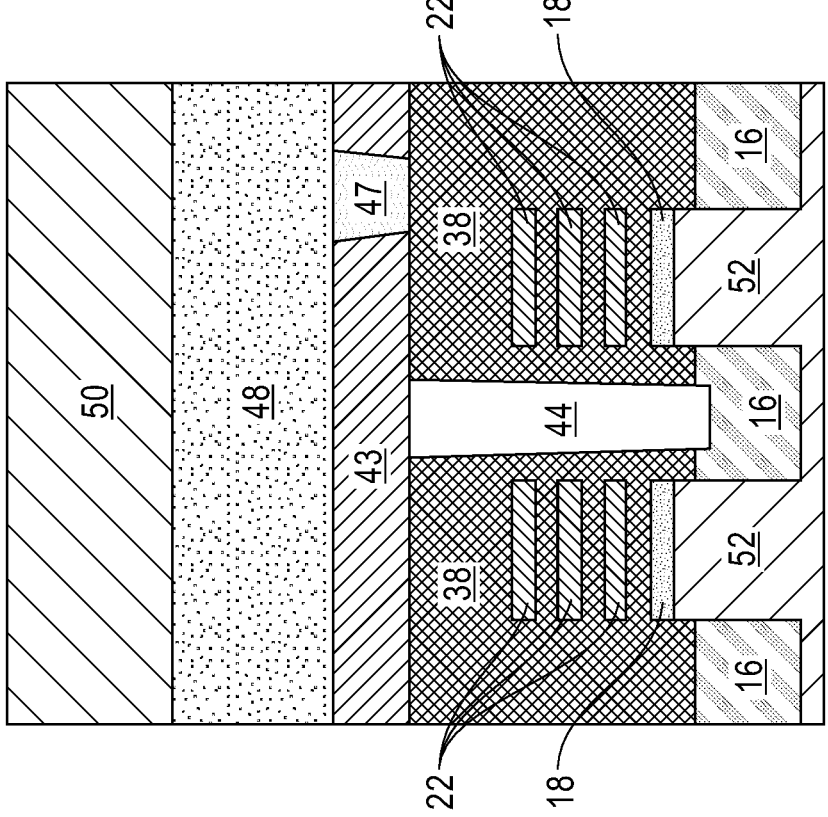

Referring now to FIGS. 12A, 12B and 12C, there are illustrated the exemplary semiconductor structure shown in FIGS. 11A, 11B and 11C, respectively, after forming an opening 54 in the first backside ILD layer 52 that physically exposes one of the dielectric structures 36. The physically exposed dielectric structure 36 is located beneath a source/drain region 40 that lacks frontside source/drain contact structure 46. The opening 54 can be formed by lithography and etching. The etch can include a RIE. The etch stops on a surface of the dielectric structure 36 that is located beneath the source/drain region 40 that lacks frontside source/drain contact structure 46.

Figure 13A:
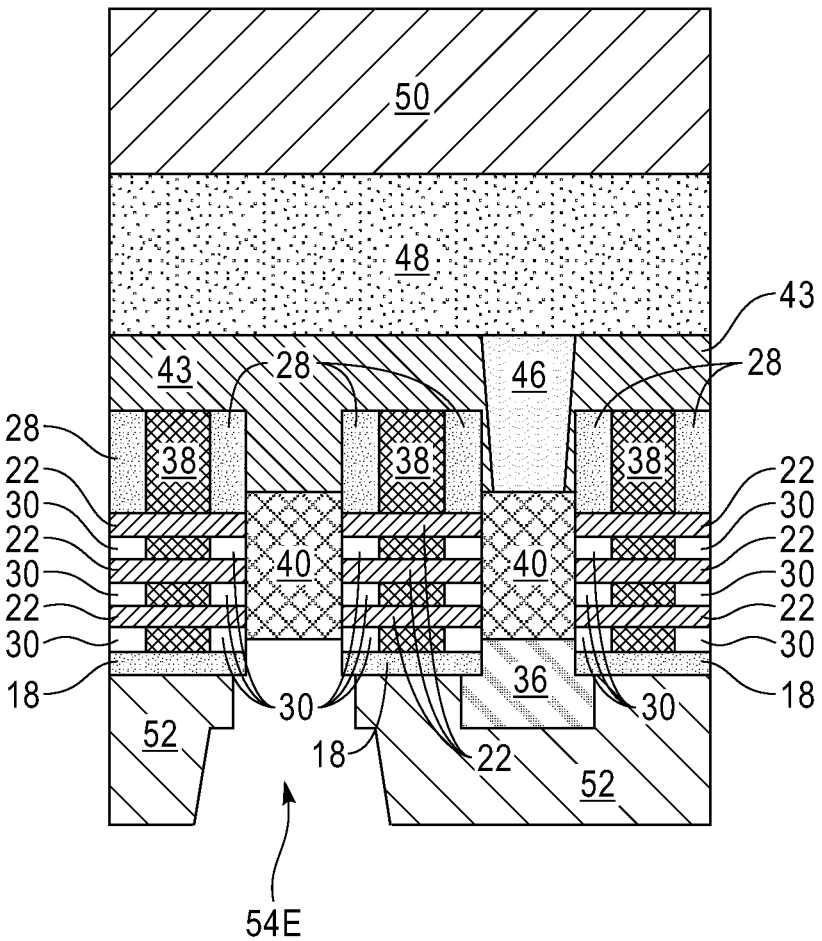
FIGS. 13A, 13B and 13C are cross sectional views of the exemplary semiconductor structure shown in FIGS. 12A, 12B and 12C, respectively, after removing the physically exposed dielectric structure to providing an extended opening that physically exposes one of the source/drain regions.
Figures 13B, 13C:
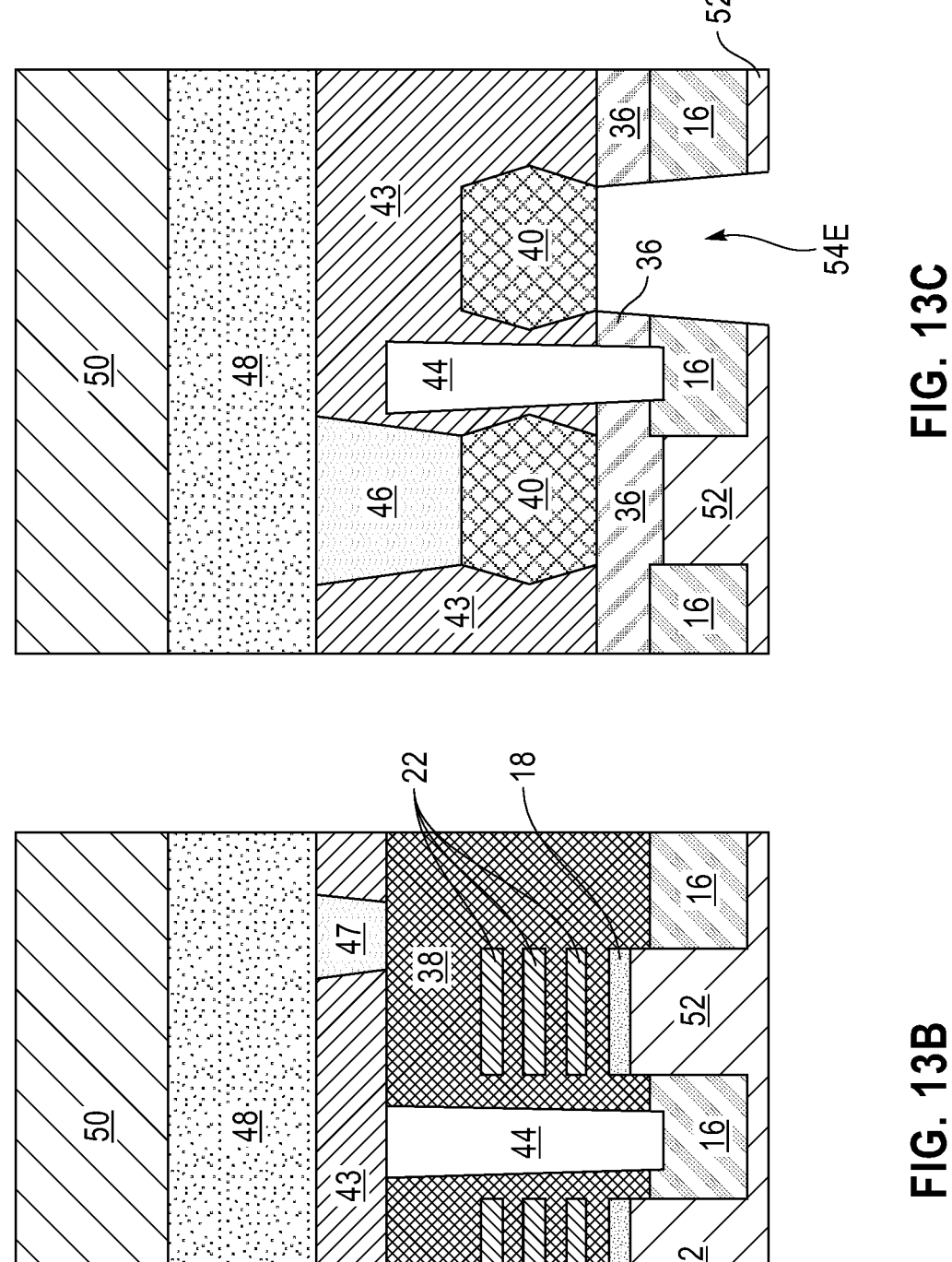

Referring now to FIGS. 13A, 13B and 13C, there are illustrated the exemplary semiconductor structure shown in FIGS. 12A, 12B and 12C, respectively, after removing the physically exposed dielectric structure 36 to providing an extended opening 54E that physically exposes one of the source/drain regions 40. The extended opening 54E can be referred to as a backside source/drain contact opening. The physically exposed source/drain region 40 lacks the frontside source/drain contact structure 46. The extended opening 54E can be formed by an etch that is selective in removing the dielectric structure 36 relative to the bottom dielectric isolation layer 18. The etch can include a RIE. The etch stops on a surface of the source/drain region 40 that lacks the frontside source/drain contact structure 46.

Figure 14A:
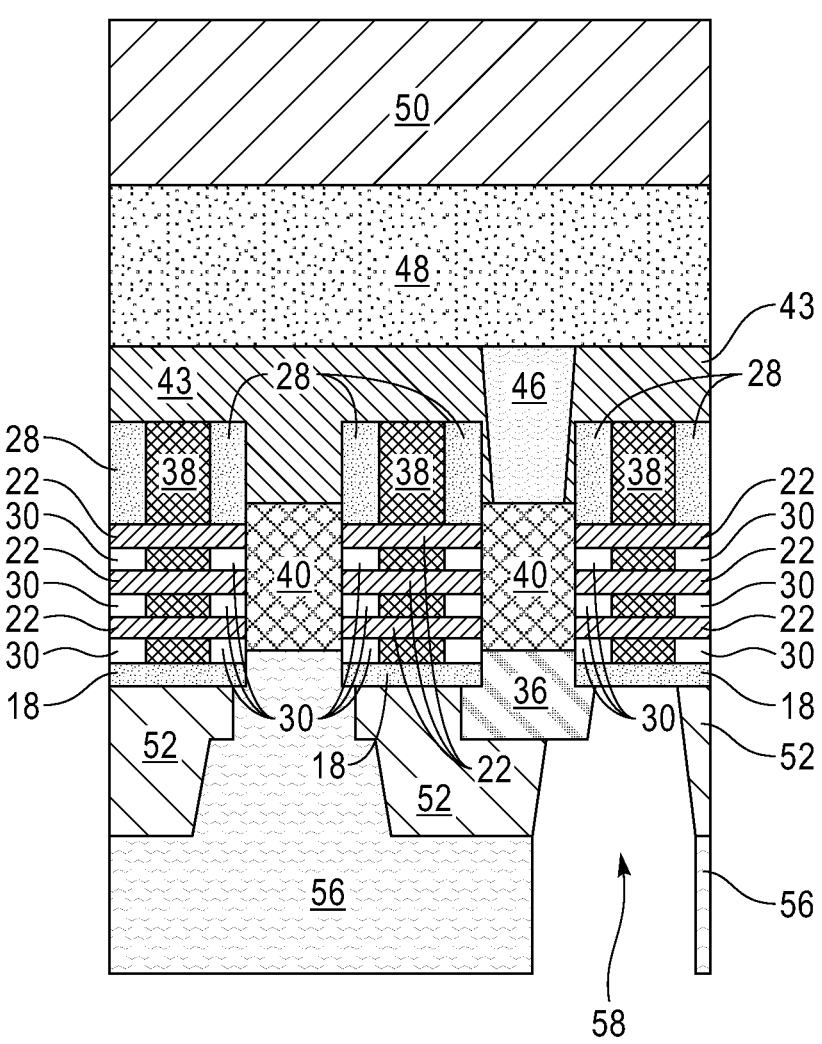
FIGS. 14A, 14B and 14C are cross sectional views of the exemplary semiconductor structure shown in FIGS. 13A, 13B and 13C, respectively, after forming an organic planarization layer (OPL) and forming backside contact openings.
Figure 14C:
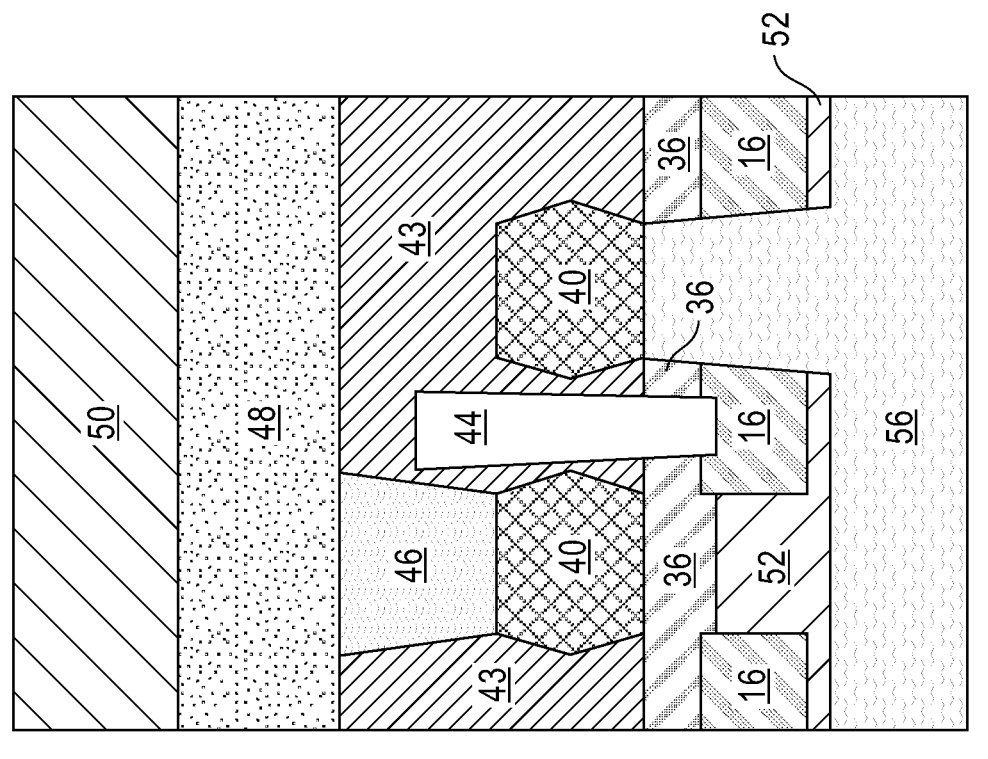
Figure 14B:
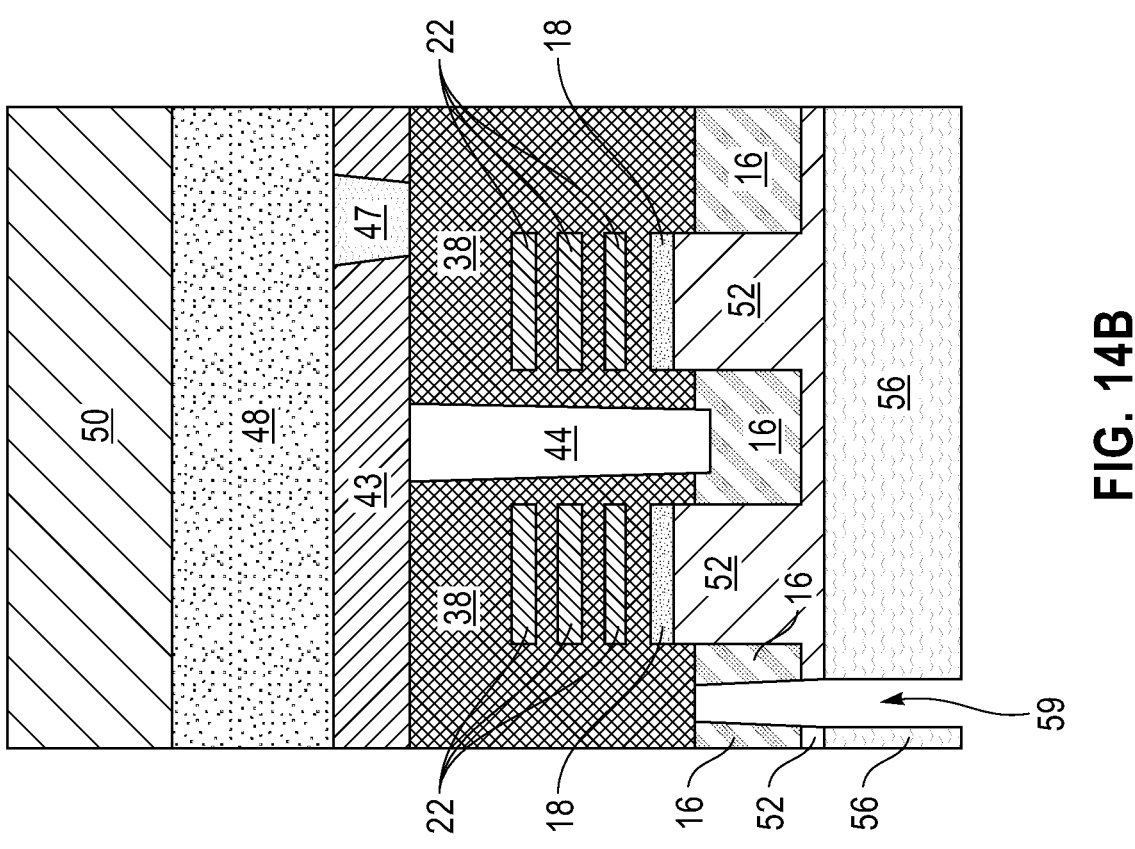

Referring now to FIGS. 14A, 14B and 14C, there are illustrated the exemplary semiconductor structure shown in FIGS. 13A, 13B and 13C, respectively, after forming an organic planarization layer (OPL) 56 and forming backside contact openings 58, 59. The backside contact openings 58, 59 can be referred to as backside gate contact openings. The OPL 56 can be formed by a deposition process including, for example, CVD, PECVD or spin-on coating. The OPL 56 is then patterned by lithography and etching to include openings therein. An etch is then used to transfer the openings in the OPL 56 into the first backside ILD layer 52 and one of the shallow trench isolation structures 16. Backside contact opening 58 physically exposed a portion of the bottom dielectric isolation layer 18, while backside contact opening 59 physically exposes a surface of one of the gate structures 38.

Figure 15A:
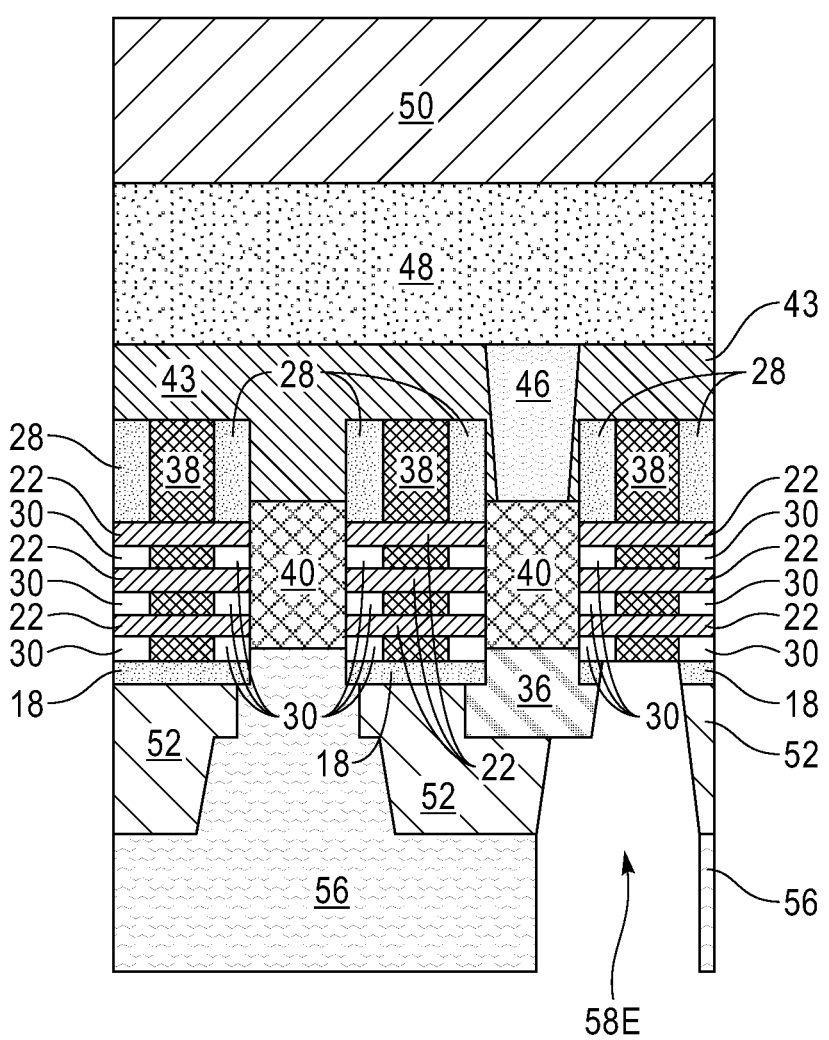
FIGS. 15A, 15B and 15C are cross sectional views of the exemplary semiconductor structure shown in FIGS. 14A, 14B and 14C, respectively, after extending the backside contact opening through the bottom dielectric isolation layer so as to physically expose a portion of one of the gate structures.
Figure 15C:
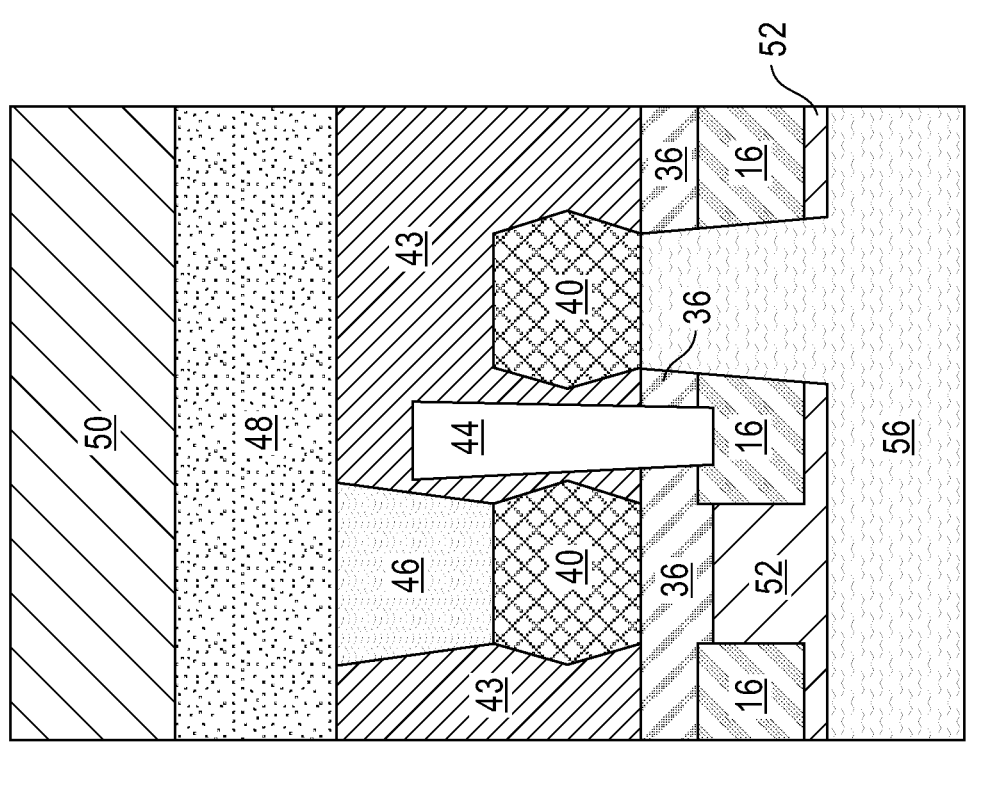
Figure 15B:
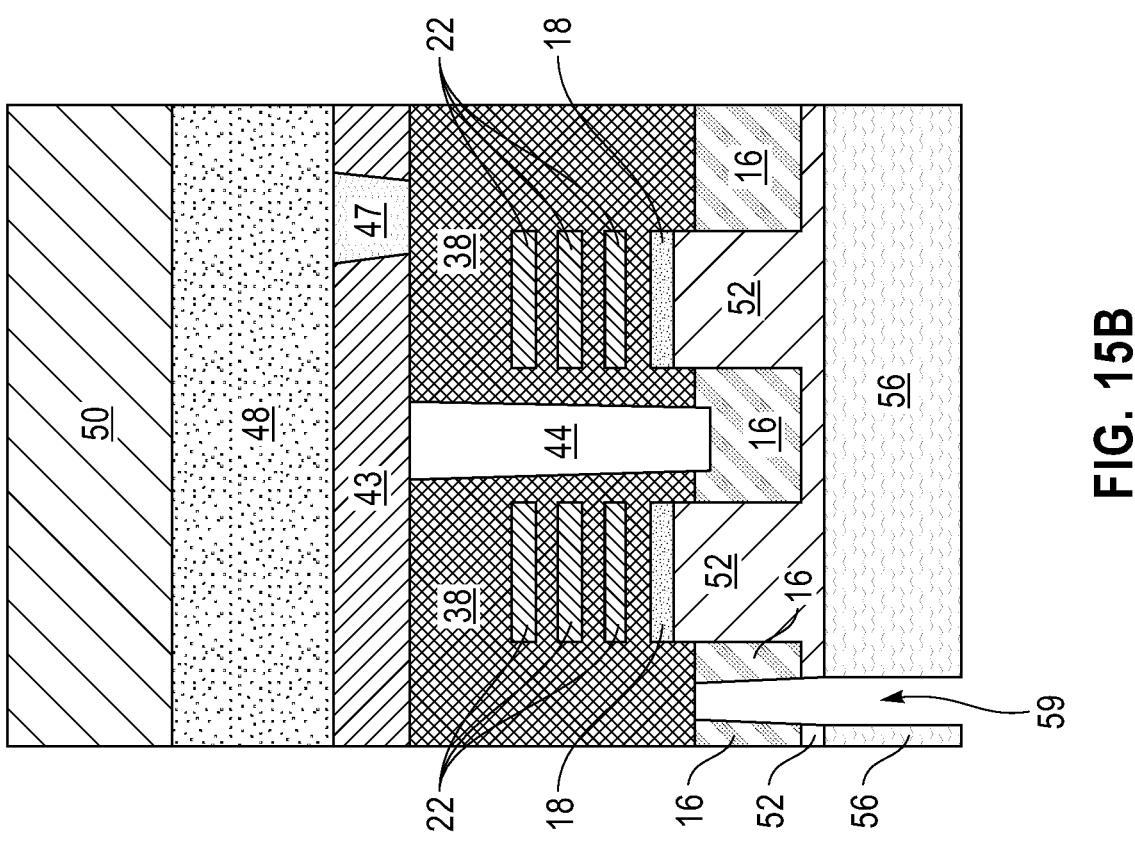

Referring now to FIGS. 15A, 15B and 15C, there are illustrated the exemplary semiconductor structure shown in FIGS. 14A, 14B and 14C, respectively, after extending the backside contact opening 58 through the bottom dielectric isolation layer 18 so as to physically expose a portion of one of the gate structures 38. The extended backside contact opening is labeled as 58E in FIG. 15A. This step includes an etch that is selective in removing the bottom dielectric isolation layer 18 relative to the dielectric structure 36. The extended backside contact opening 58E physically exposes portions (i.e., a sidewall and a horizontal surface) of the dielectric structure 36 as is shown in FIG. 15A.

Figure 16A:
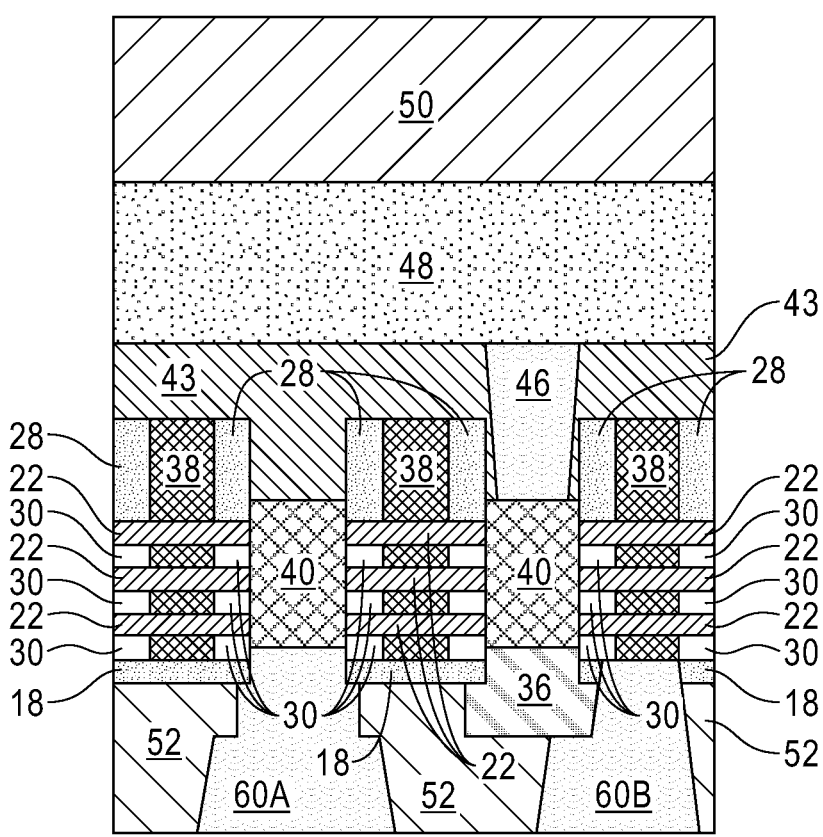
FIGS. 16A, 16B and 16C are cross sectional views of the exemplary semiconductor structure shown in FIGS. 15A, 15B and 15C, respectively, after removing the OPL, and forming backside contact structures including a backside source/drain contact structure and backside gate contact structures.
Figures 16B, 16C:
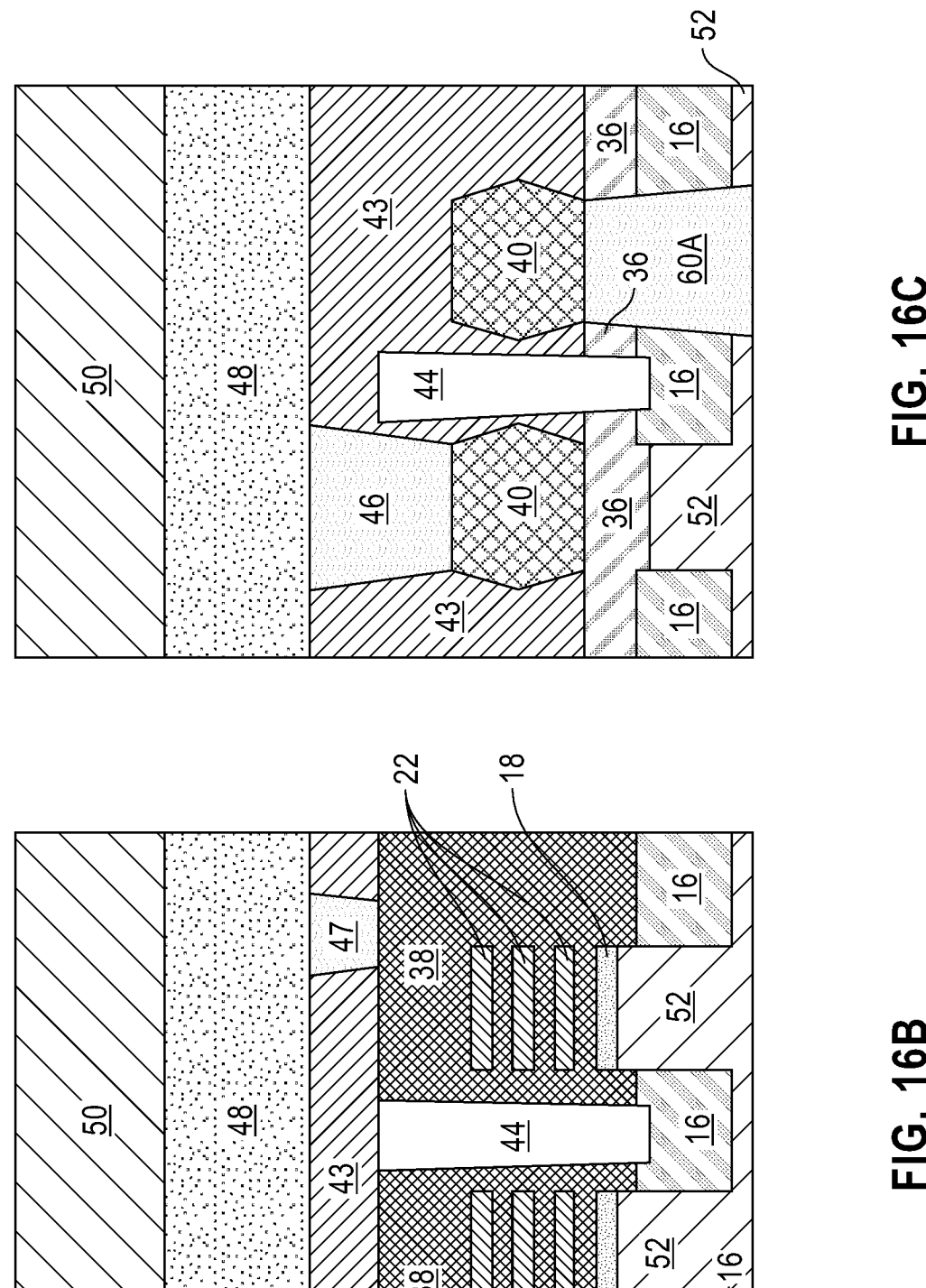

Referring now to FIGS. 16A, 16B and 16C, there are illustrated the exemplary semiconductor structure shown in FIGS. 15A, 15B and 15C, respectively, after removing the OPL 56, and forming backside contact structures including a backside source/drain contact structure 60A and backside gate contact structures 60B, 60C. In the present application, backside contact structure 60A physically contacts one of the source/drain regions 40, the backside gate contact structure 60B physically contacts the physically exposes portions (i.e., a sidewall and a horizontal surface) of the dielectric structure 36 and the gate structure 38 as is shown in FIG. 16A, while the gate contact structure 60C physically contacts a sidewall of the shallow trench isolation structure 16 and contacts another of the gate structures 38.

The OPL 56 can be removed utilizing any material removal process that is selective in removing the OPL 56 from the structure. Extended opening 54E is revealed after removing the OPL 56 from the structure.

Backside source/drain contact structure 60A and backside gate contact structures 60B, 60C are then formed utilizing by filling (including deposition and planarization) each of the backside contact openings (i.e., openings 54E, 58E and 59) with at least a contact conductor material. The contact conductor material can include, for example, a silicide liner, such as Ni, Pt. NiPt, an adhesion metal liner, such as TiN, and conductive metals such as W, Cu, Al, Co, Ru, Mo, Os, Ir, Rh, or an alloy thereof. These backside contact structures can also include one or more contact liners (not shown). In one or more embodiments, the contact liner (not shown) can include a diffusion barrier material. Exemplary diffusion barrier materials include, but are not limited to, Ti, Ta, Ni, Co. Pt. W, Ru, TiN, TaN, WN, WC, an alloy thereof, or a stack thereof such as Ti/TiN and Ti/WC. In one or more embodiments in which a contact liner is present, the contact liner (not shown) can include a silicide liner, such as Ti, Ni, NiPt, etc., and a diffusion barrier material, as defined above.

Referring now to FIGS. 17A, 17B and 17C, there are illustrated the exemplary semiconductor structure shown in FIGS. 16A, 16B and 16C, respectively, after forming a first backside metal level, BSM1, and a backside BEOL structure 66. The first backside metal level, BSM1, is located between backside BEOL structure 66 and both backside source/drain contact structure 60A and backside gate contact structure 60C. The first backside metal level, BSM1, includes backside interconnects 64 that electrically connects backside BEOL structure 66 to backside source/drain contact structure 60A and backside gate contact structure 60C. Backside interconnects 64 are signal wires. Backside interconnects 64 are embedded in a second backside ILD layer 62.

The second backside ILD layer 62 can include one of the dielectric materials mentioned above for the frontside ILD layer 42. The dielectric material that provides the second backside ILD layer 62 can be compositionally the same as, or compositionally different than, the dielectric material that provides the first backside ILD layer 52. The second backside ILD layer 62 can be formed utilizing one of the deposition processes mentioned above in forming the frontside ILD layer 42. A planarization process can follow the deposition process.

Next, backside interconnect contact openings are formed into the second backside ILD layer 62 utilizing lithography and etching. Each backside interconnect opening is then filled with an electrically conductive metal or electrically conductive metal alloy. In some embodiments, Cu or a Cu—Al alloy can be used as the electrically conductive material. A planarization process is then performed. These steps form backside interconnects 64 in the second backside ILD layer 62. As is shown, one of the backside interconnects 64 can be formed in contact with the backside source/drain contact structure 60A, another of the backside interconnects 64 can be formed in contact with the backside gate contact structure 60B, while another of the backside interconnects 64 is formed in contact with backside gate contact structure 60C.

The backside BEOL structure 66 can include one or more interconnect dielectric material layers that contain backside metal wires (the backside metal wires can be composed of any electrically conductive metal or electrically conductive metal alloy) embedded therein. At least 90% of the backside metal wires are signal metal wires; the remainder backside metal wires which are usually present in metal levels furthest from the transistor, can be used as power distribution wires. Backside BEOL structure 66 can include "y" numbers of backside metal levels, wherein "y" is an integer starting from 1. In the present application, the majority of the signal wiring is present in the first two backside metal levels, this includes BSM1 mentioned above. The backside BEOL structure 66 can be formed utilizing techniques well known to those skilled in the art. In some embodiments, the backside metal wires within the backside BEOL structure 66 are composed of Cu. It is noted that in the present application, at least 90%, typically at least 95% of the backside metal wires that are present in backside BEOL structure 66 are used as signal wires. These threshold of at least 990% and at least 95% ease testing and device verification concerns.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:
1. A semiconductor device comprising:
a transistor located in a frontside of the device, the transistor including a gate structure located adjacent to a pair of source/drain regions;
a frontside BEOL structure comprising frontside metal wires located in the frontside of the device; and
a backside BEOL interconnect structure comprising backside metal wires located in a backside of the device, wherein at least 90% of the frontside metal wires are power distribution metal wires and at least 90% of the backside metal wires are signal wires.
2. The semiconductor device of claim 1, further comprising a middle-of-the- line (MOL) level located between the frontside BEOL structure and the transistor.

3. The semiconductor device of claim 2, wherein the MOL level comprises a frontside source/drain contact structure embedded in a MOL dielectric layer.

4. The semiconductor device of claim 3, wherein the frontside source/drain contact structure electrically connects one source/drain region of the pair of source/drain regions of the transistor to the frontside BEOL structure.

5. The semiconductor device of claim 4, further comprising a backside source/drain contact structure contacting a surface of the other source/drain region of the pair of source/drain regions of the transistor and a backside gate contact structure contacting the gate structure of the transistor.

6. The semiconductor device of claim 5, wherein the backside source/drain contact structure and the backside gate contact structure are both embedded in a backside interlayer dielectric layer.

7. The semiconductor device of claim 6, wherein the backside gate contact structure passes through a shallow trench isolation structure and the shallow trench isolation is present in the backside interlayer dielectric layer.

8. The semiconductor device of claim 5, wherein further comprises a first backside metal level located between backside BEOL structure and both the backside source/drain contact structure and the backside gate contact structure, wherein the first backside metal level comprises backside interconnects that electrically connect the backside BEOL structure to the backside source/drain contact structure and the backside gate contact structure, wherein the backside interconnects are signal wires.

9. The semiconductor device of claim 8, wherein the backside interconnects are embedded in a backside interlayer dielectric layer.

10. The semiconductor device of claim 4, wherein the one source/drain region of the pair of source/drain regions that is electrically connected to the frontside BEOL structure is located on a surface of a dielectric structure, the dielectric structure is present in both the frontside and the backside of the device.

11. The semiconductor device of claim 10, further comprising a bottom dielectric isolation layer located beneath the transistor and adjacent to the dielectric structure.

12. The semiconductor device of claim 11, wherein the dielectric structure contacts a sidewall of the bottom dielectric isolation layer.

13. The semiconductor device of claim 10, further comprising another transistor located adjacent to the transistor, wherein the another transistor comprises another gate structure, and the another transistor comprises the one source/drain region of the pair of source/drain regions that is electrically connected to the frontside BEOL structure as one of the another transistor source/drain regions.

14. The semiconductor device of claim 13, further comprising another backside gate contact structure contacting the another gate structure and a sidewall and a horizontal surface of the dielectric structure.

15. The semiconductor device of claim 14, further comprises another bottom dielectric isolation layer located beneath the another transistor, wherein the another backside gate contact structure passes through the another bottom dielectric isolation layer.

16. The semiconductor device of claim 13, further comprises a first backside metal level located between the backside BEOL structure and the another backside gate contact structure, wherein the first backside metal level includes a backside interconnect connecting the another backside gate contact structure to the backside BEOL structure, and the backside interconnect is a signal wire.

17. The semiconductor device of claim 16, wherein the backside interconnect is embedded in a backside interlayer dielectric layer.

18. The semiconductor device of claim 1, wherein the transistor is a nanosheet transistor comprising a vertical stack of suspended semiconductor channel material nanosheets, and wherein the gate structure of the transistor wraps around each semiconductor channel material nanosheet of the vertical stack of suspended semiconductor channel material nanosheets.

19. A semiconductor device comprising:
   a transistor located in a frontside of the device, the transistor including a gate structure located adjacent to a pair of source/drain regions;
   a frontside BEOL structure comprising frontside metal wires located in the frontside of the device;
   a backside BEOL interconnect structure comprising backside metal wires located in a backside of the device, wherein at least 90% of the frontside metal wires are power distribution metal wires and at least 90% of the backside metal wires are signal wire; and
   a frontside gate contact structure connecting another gate structure of another transistor to the frontside BEOL structure, wherein the another gate structure of the another transistor is tied-off.

* * * * *